United States Patent
Hanawa et al.

(10) Patent No.: US 6,248,250 B1
(45) Date of Patent: *Jun. 19, 2001

(54) RF PLASMA REACTOR WITH HYBRID CONDUCTOR AND MULTI-RADIUS DOME CEILING

(75) Inventors: Hiroji Hanawa; Gerald Zheyao Yin, both of Sunnyvale; Diana Xiaobing Ma, Saratoga; Philip M. Saizman, San Jose; Peter K. Loewenhardt, Santa Clara; Allen Zhao, Mountain View, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/897,436

(22) Filed: Jul. 21, 1997

Related U.S. Application Data

(60) Division of application No. 08/597,445, filed on Feb. 2, 1996, now Pat. No. 5,777,289, which is a continuation-in-part of application No. 08/389,889, filed on Feb. 15, 1995, now Pat. No. 5,753,044.

(51) Int. Cl.[7] .............................. H05H 1/46; H01J 37/32
(52) U.S. Cl. ......................... 216/68; 438/729; 156/345; 118/723 I
(58) Field of Search .......................... 156/345; 118/723 I, 118/723 IR; 216/68; 438/729

(56) References Cited

U.S. PATENT DOCUMENTS

| | | |
|---|---|---|
| 4,795,529 | 1/1989 | Kawasaki et al. . |
| 4,842,683 | 6/1989 | Cheng et al. . |
| 4,844,775 | 7/1989 | Keeble . |
| 4,872,947 | 10/1989 | Wang et al. . |
| 4,948,458 | 8/1990 | Ogle . |
| 4,990,229 | 2/1991 | Campbell et al. . |
| 4,992,665 | 2/1991 | Mohl . |
| 5,122,251 | 6/1992 | Campbell et al. . |
| 5,234,529 | 8/1993 | Johnson . |
| 5,277,751 | 1/1994 | Ogle . |
| 5,280,154 | 1/1994 | Cuomo et al. . |
| 5,346,578 | 9/1994 | Benzing et al. . |
| 5,368,710 | 11/1994 | Chen et al. . |
| 5,401,350 | 3/1995 | Patrick et al. . |
| 5,449,432 | 9/1995 | Hanawa . |
| 5,614,055 | 3/1997 | Fairbairn et al. . |
| 5,777,289 | * 7/1998 | Hanawa et al. .................. 156/345 X |

FOREIGN PATENT DOCUMENTS

| | | |
|---|---|---|
| 0 379 828 A2 | 8/1990 | (EP) . |
| 0 379 828 A3 | 8/1990 | (EP) . |
| 489 407 A2 | 6/1992 | (EP) . |
| 0 520 519 A1 | 12/1992 | (EP) . |
| 0 552 491 A1 | 7/1993 | (EP) . |
| 0 596 551 A1 | 5/1994 | (EP) . |
| 0 641 013 A2 | 3/1995 | (EP) . |
| 0 685 873 A1 | 12/1995 | (EP) . |
| 0694949 | 1/1996 | (EP) . |
| 0742577 | 11/1996 | (EP) . |
| 0641013 | 3/1997 | (EP) . |
| 231197 | 8/1925 | (GB) . |
| WO 92/20833 | 11/1992 | (WO) . |

\* cited by examiner

*Primary Examiner*—Thi Dang
(74) *Attorney, Agent, or Firm*—Michaelson & Wallace

(57) ABSTRACT

The present invention adheres to an optimized coil-domed geometry including a particular dome apex height range relative to the dome base and a particular wafer position range relative to the dome apex.

31 Claims, 19 Drawing Sheets

RF PLASMA REACTOR WITH HYBRID CONDUCTOR AND MULTI-RADIUS DOME CEILING

This is a division, of application Ser. No. 08/597,445, filed Feb. 2, 1996, now U.S. Pat. No. 5,777,289 which is a continuation-in-part of Ser. No. 08/389,889, filed Feb. 15, 1997, now U.S. Pat. No. 5,753,044.

BACKGROUND OF THE INVENTION

1. Technical Field the invention is related to radio frequency (R.F) inductively or capacitively coupled plasma reactors used in processing semiconductor wafers, and in particular to improvements therein for increasing the plasma ion density uniformity across the wafer surface.

2. Background Art

Inductively coupled plasma reactors are currently used to perform various processes on semiconductor wafers including metal etching, dielectric etching and chemical vapor deposition, as some examples. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the antenna and the DC bias power applied to the wafer pedestal are separately controlled RF supplies. Separating the bias and source power supplies facilitates independent control of ion density and ion energy, in accordance with well-known techniques. To produce an inductively coupled plasma, the antenna is a coil inductor adjacent the chamber, the coil inductor being connected to the RF source power supply. The coil inductor provides the RF power which ignites and sustains the plasma. The geometry of the coil inductor can in large part determine spatial distribution of the plasma ion density within the reactor chamber.

One problem with such a plasma reactor is that the spatial distribution of the plasma ion density across the wafer surface is often non-uniform. This is a problem in a metal etch process, for example, because the etch rate is affected by plasma ion density, and therefore the etch rate is non-uniform across the wafer. As a result, the etch process is difficult to control and over-etches devices on some portions of the wafer and under-etches devices on other portions of the wafer, leading to reduced production yield.

One of the causes of non-uniform plasma ion distribution is the coil geometry and location. Another cause is the shape of the plasma itself, which is largely determined by the shape of the reactor chamber, particularly the reactor chamber ceiling.

Generally, the coil inductor of an inductively coupled plasma reactor is wrapped around the reactor chamber, although it does not necessarily conform to the shape of the reactor chamber walls. Necessarily, different regions of the wafer surface are displaced from the nearest coil windings by different distances and therefore experience different plasma ion densities.

Depending upon the shape of the reactor chamber ceiling, more plasma volume is located over the wafer center and less over the wafer edges, particularly in the case of a conical or hemispherical ceiling, for example. Accordingly, there tends to be inherent spatial non-uniformities in the ion flux density.

A different approach is disclosed in U.S. Pat. No. 4,948,458 to James Ogle in which a plasma reactor has a flat ceiling and a flat coil antenna overlying the ceiling. However, this approach has generally been found to provide no improvement in plasma ion density uniformity and moreover suffers from relatively large capacitive coupling in the plasma, hindering control of the plasma ion energy. A modification of that approach is disclosed in U.S. Pat. No. 5,368,710 to Chen et al., in which an attempt is made to adjust the plasma characteristics such as density by increasing the thickness of the dielectric chamber cover toward the center of the chamber. However, no versatile flexible way of adjusting plasma characteristics is facilitated with such a technique.

U.S. Pat. No. 5,346,578 assigned to Novellus discloses a reactor having an arcuate ceiling. However, no versatile flexible way of adjusting plasma characteristics is facilitated with such a technique.

Thus, there is a need for a plasma reactor which permits flexible versatile adjustment of plasma characteristics to optimize uniformity of plasma ion density distribution.

SUMMARY OF THE INVENTION

The invention is embodied in an inductively coupled RF plasma reactor for processing a semiconductor wafer, the reactor including a reactor chamber having a side wall and a ceiling, a wafer pedestal for supporting the wafer in the chamber, an RF power source, apparatus for introducing a processing gas into the reactor chamber, and a coil inductor adjacent the reactor chamber connected to the RF power source, the coil inductor including (a) a side section facing a portion of the side wall and including a bottom winding and a top winding, the top winding being at a height corresponding at least approximately to a top height of the ceiling, and (b) a top section extending radially inwardly from the top winding of the side section so as to overlie at least a substantial portion of the ceiling. Preferably, the ceiling includes a dome-shaped ceiling which can be a multi-radius dome-shaped having a minimum radius of curvature near a periphery of the ceiling and maximum radius of curvature near an apex of the ceiling. Preferably, the top section is a flat disk-shaped coil while the side section is ether a cylindrically-shaped coil, truncated conically-shaped coil whose radius decreases from bottom to top or a curved-shaped winding whose radius decreases from bottom to top. In one embodiment, the side section and the top section are formed as a single continuous coiled conductor. In another embodiment, the top section and the side section are separate windings and wherein the RF power source includes a pair of independent RF power sources, each of the independent RF power sources being connected to a respective one of the top section and the side section so as to enable independent control of RF power in each one of the top section and the side section.

The invention is embodied in a method of processing a workpiece in a plasma reactor, which includes providing in the reactor a pedestal defining thereon a workstation of a diameter d and placing on the pedestal a workpiece of similar diameter, providing a chamber enclosure, the enclosure including a side wall having a top and a ceiling having a base over the top of the side wall and a ceiling apex above the base, providing an inductive coil adjacent the ceiling and capable of being coupled to an RF power supply, and setting the height of the pedestal such that the base is at a height h above the pedestal and the ceiling apex is at a height H above the base, wherein H+h is on the order of approximately 4" and 7" for the workstation diameter d with in a range between the order of about 6" and about 12".

DETAILED DESCRIPTION OF THE PREFERRED EMBODIMENTS

The preferred embodiments of the invention described herein make reference to a plasma power source employing a conductor connected to an RF power source and overlying the plasma chamber ceiling, the conductor preferably being a coiled inductor or antenna, for example, of particular shapes and ranges of shapes. However, the invention also may be implemented using a plasma power source employing a conductor which is a capacitive electrode of the same particular shapes and ranges of shapes, the coil windings being replaced by a single integral conductive film as the capacitive electrode. In either case, the conductor (i.e., the coil windings or the integral conductive film) defines or conforms to a three dimensional surface or shape lying within a range of shapes to be described below, such as a truncated cone, a cylinder, a dome and a multi-radius dome, for example.

The present invention enables the sculpting or adjusting the shape of the plasma ion density by varying the shape of either or both the conductor and the ceiling. The ceiling shape is adjusted preferably by providing a multi-radius dome-shaped ceiling and individually adjusting the different radii of the ceiling to achieve a desired ceiling shape. The multi-radius dome embodiment of the ceiling is the preferred embodiment because it has greater plasma power efficiency than any other ceiling shape including a single-radius (hemispherical) dome. For a given ceiling shape, the conductor shape is adjusted within a continuous range of shapes from a right cylinder shape at one extreme, to a shape exactly conforming with the ceiling, to either a non-arcuate shape or a right cylinder shape at the other extreme of the range, as will be described below with greater particularity.

These adjustments enable the plasma ion density to approach optimal uniformity across the wafer surface, thereby achieving optimum processing uniformity. Such adjustments affect the plasma ion density because the ion density is affected by three factors, namely ion diffusion, local ionization near the coil inductor and local recombination near surfaces such as the ceiling surface. In a reactor in which the distances between the wafer and the ceiling and between the wafer and the coil inductor are relatively short (e.g., on the order of, but not necessarily limited to, less than 30 cm and 32 cm, respectively), the latter two factors (local ionization near the coil inductor and local recombination near the ceiling surface) are significant and the present invention can be employed to good effect. Thus, changing the coil inductor shape changes the spatial profile of local ionization near the coil inductor, while changing the multi-radius ceiling shape changes the spatial profile of the local recombination at the interior ceiling surface, thus reshaping the plasma ion density.

Figure 1:
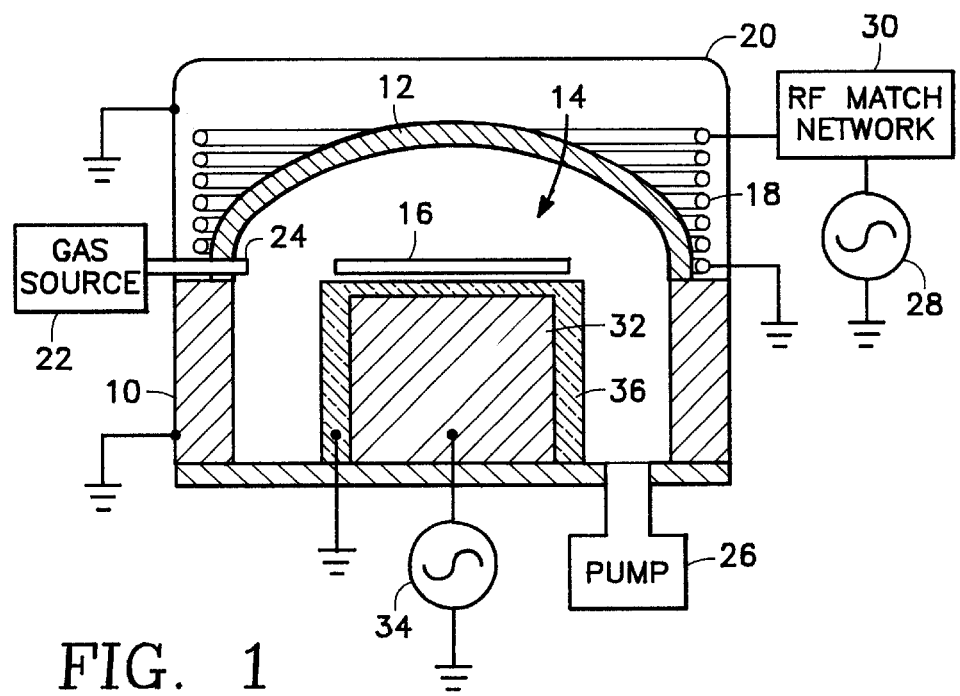
FIG. 1 is a simplified cut-away side view of an inductively coupled RF plasma reactor corresponding to a first embodiment of the invention.

Referring to FIG. 1, an inductively coupled RF plasma reactor includes a reactor chamber having a grounded conductive cylindrical sidewall 10 and a dielectric ceiling 12, the reactor including a wafer pedestal 14 for supporting a semiconductor wafer 16 in the center of the chamber, a cylindrical inductor coil 18 surrounding an upper portion of the chamber beginning near the place of the top of the wafer or wafer pedestal 14 and extending upwardly therefrom toward the top of the chamber, a processing gas source 22 and gas inlet 24 for furnishing a processing gas into the chamber interior and a pump 26 for controlling the chamber pressure. The coil inductor 18 is energized by a plasma source power supply or RF generator 28 through a conventional active RF match network 30, the top winding of the coil inductor 18 being "hot" and the bottom winding being grounded. The wafer pedestal 14 includes an interior conductive portion 32 connected to a bias RF power supply or generator 34 and an exterior grounded conductor 36 (insulated from the interior conductive portion 32). A conductive grounded RF shield 40 surrounds the coil inductor 18.

In accordance with one aspect of the invention, uniformity of the plasma density spatial distribution across the wafer is improved (relative to conical or hemispherical ceilings) by shaping the ceiling 12 in a multi-radius dome and individually determining or adjusting each one of the multiple radii of the ceiling 12. The multiple-radius dome shape in the particular embodiment of FIG. 1 somewhat flattens the curvature of the dome ceiling 12 around the center portion of the dome, the peripheral portion of the dome having a steeper curvature. The multiple-radius dome ceiling of FIG. 1 has two radii, namely a 15 inch (37.5 cm) radius R at the top and a 3.5 inch (8.75 cm) radius r at the corner. In another embodiment, the top radius R is 13 inches (32.5 cm) while the corner radius r is 4 inches (10 cm).

In accordance with one feature of the invention, there is an approximately 10 cm (4 in.) space or horizontal distance between the circumferential edge of the wafer 16 and the inner surface of the dome 12 intersected by the plane of the wafer surface. This assures uniform plasma processing of the wafer substantially free of edge effects. Depending upon application, this space may lie in the range of about 8 cm to 15 cm, but is not necessarily limited thereto.

Figure 2:
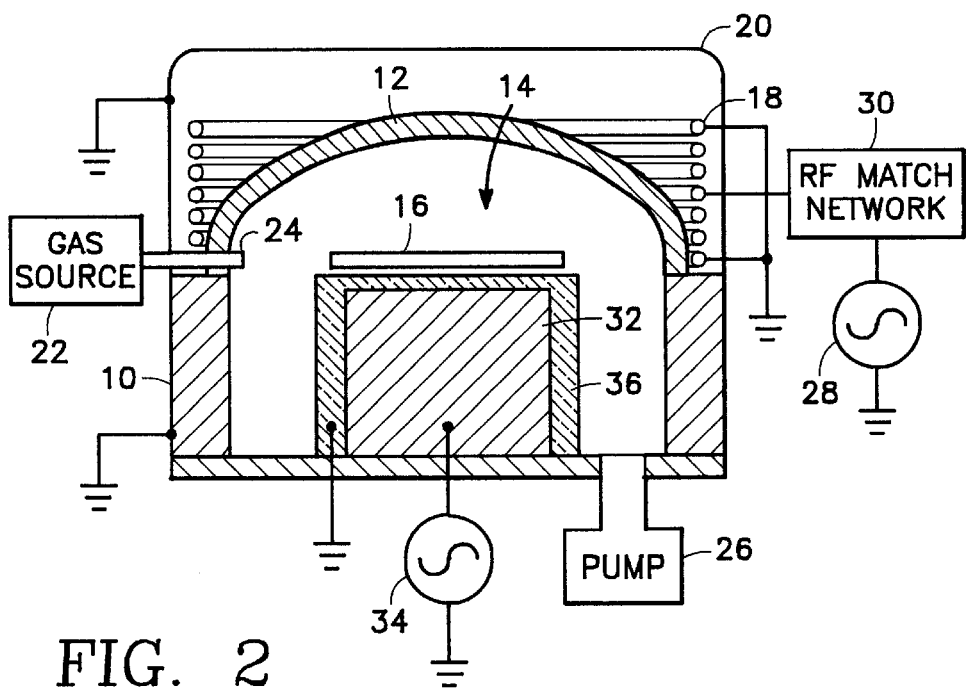
FIG. 2 is a simplified cut-away side view of an inductively coupled RF plasma reactor corresponding to a second embodiment of the invention.

As illustrated in FIG. 2, the coil inductor 18 may be coupled to the RF power source 28, 30 in a mirror coil configuration disclosed in co-pending U.S. application Ser. No. 08/277,531 filed Jul. 18, 1994 by Gerald Yin et al., entitled "PLASMA REACTOR WITH MULTI-SECTION RF COIL AND ISOLATED CONDUCTING LID" and assigned to the present assignee. In the mirror coil configuration of FIG. 2, the RF source 28, 30 is connected to the center winding of the coil inductor 18 while the top and bottom ends of the coil inductor are both grounded. As described in the above-referenced application by Gerald Yin et al., the mirror coil configuration has the advantage of reducing the maximum potential on the coil.

Figure 3:
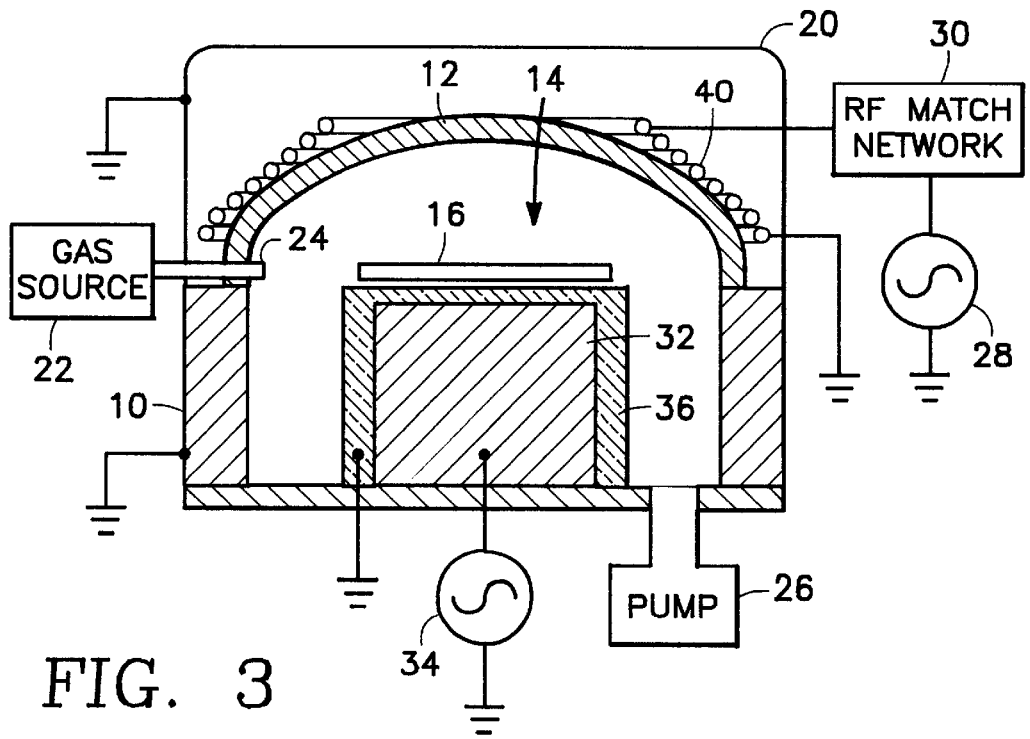
FIG. 3 is a simplified cut-away side view of an inductively coupled RF plasma reactor corresponding to a third embodiment of the invention.
Figure 4:
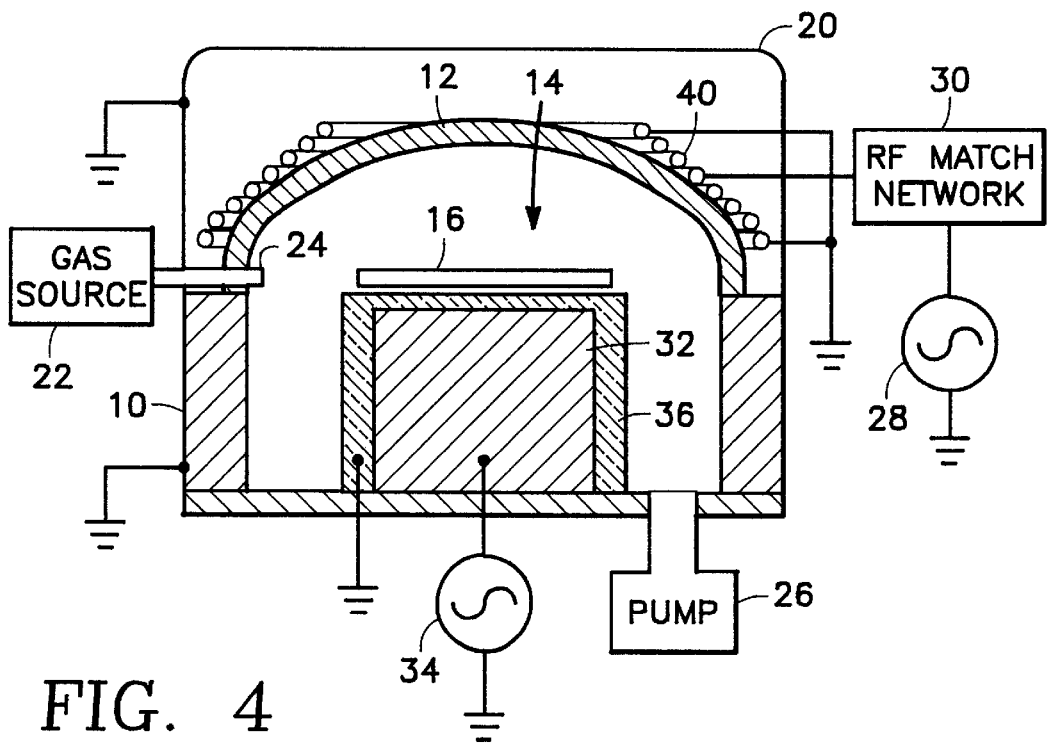
FIG. 4 is a simplified cut-away side view of an inductively coupled RF plasma reactor corresponding to a fourth embodiment of the invention.

The plasma density distribution may be varied from that obtained in the embodiment of FIG. 1 by providing a partial conical coil inductor 40 as illustrated in FIG. 3, instead of the cylindrical coil inductor. The upper windings of the conical coil inductor 40 of FIG. 3 are closer to the wafer 16 than are the upper windings of the cylindrical coil inductor 18 of FIG. 1. As illustrated in FIG. 4, the conical coil inductor 40 may be coupled to the power source 28, 30 in a mirror coil configuration analogous to that described above with reference to FIG. 2.

FIG. 4 shows that the truncated conical coil inductor 40 is spaced away from the ceiling 12 near the bottom corner of the ceiling more so than other locations along the ceiling/coil interface, due to the non-conformality between the conical coil shape and the arcuate ceiling shape. This feature advantageously suppresses sputtering at the bottom corner of the ceiling 12. For this reason, in many applications a conductor (coil inductor or capacitive electrode) which is nonconformal with the shape of the ceiling is preferred.

Figure 5:
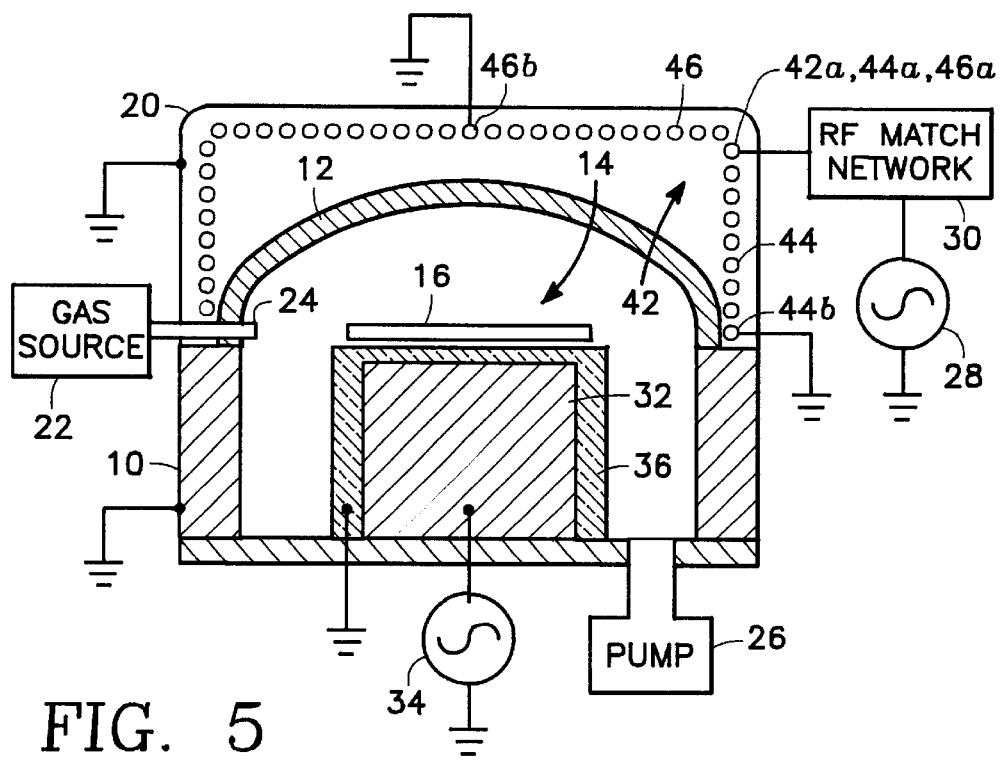
FIG. 5 is a simplified cut-away side view of an inductively coupled RF plasma reactor corresponding to a fifth embodiment of the invention.
Figure 6:
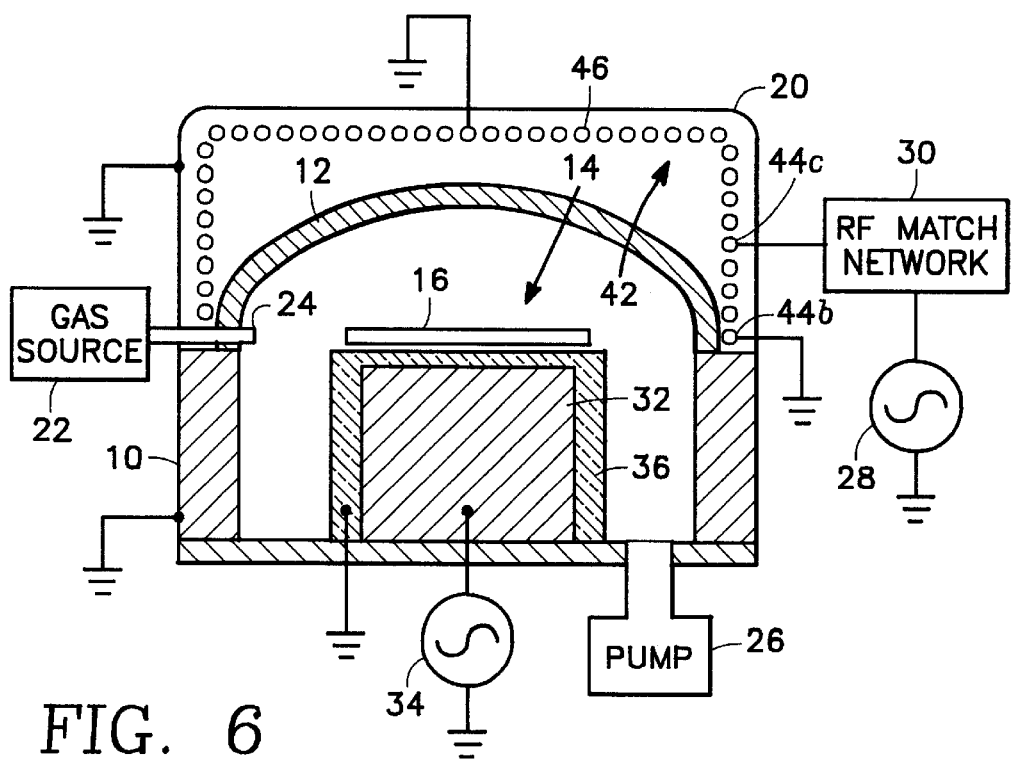
FIG. 6 is a simplified cut-away side view of an inductively coupled RF plasma reactor corresponding to a sixth embodiment of the invention.
Figure 7:
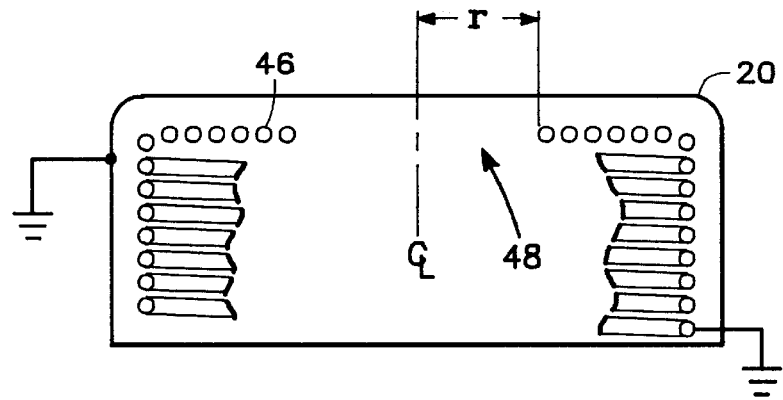
FIG. 7 is a simplified cut-away side view of an inductively coupled RF plasma reactor corresponding to a seventh embodiment of the invention.

FIG. 5 illustrates a first embodiment of the hybrid coil inductor 42 of the invention. The hybrid coil inductor 42 preferably is wound continuously from the same conductor as a unitary coil having a cylindrically shaped portion 44 and terminating in a shallow top portion 46. The cylindrically shaped portion 44 is generally configured in a manner similar to the inductor 18 of FIG. 1. The entire coil inductor 42 is energized by the same power source 28, 30. The embodiment of FIG. 5 is coupled to the power source 28, 30 in the same manner as the embodiment of FIG. 1 in which the top winding 42a is RF "hot" while the bottom winding 42b is grounded. Moreover, the top winding 42a of the hybrid coil inductor 42 is both the top winding 44a of the cylindrical portion 44 as well as being the outermost winding 46a of the shallow top portion 46. The end of the innermost winding 46b of the top portion 46 is also grounded as shown in FIG. 5. FIG. 6 illustrates how the embodiment of FIG. 5 may be modified by moving the connection of the power source 28, 30 to a winding other than the top winding 42a, such as the middle winding 44c of the cylindrical portion 44. FIG. 7 illustrates a modification in which the shallow top portion 46 has an empty space or opening 48 of inner radius r. This inner opening can compensate for the tendency of the top portion 46 to provide a higher plasma ion density at the wafer center, so that the embodiment of FIG. 7 provides a more uniform plasma ion density with the opening 48 than the embodiments of FIGS. 5 or 6 in general.

Figure 8:
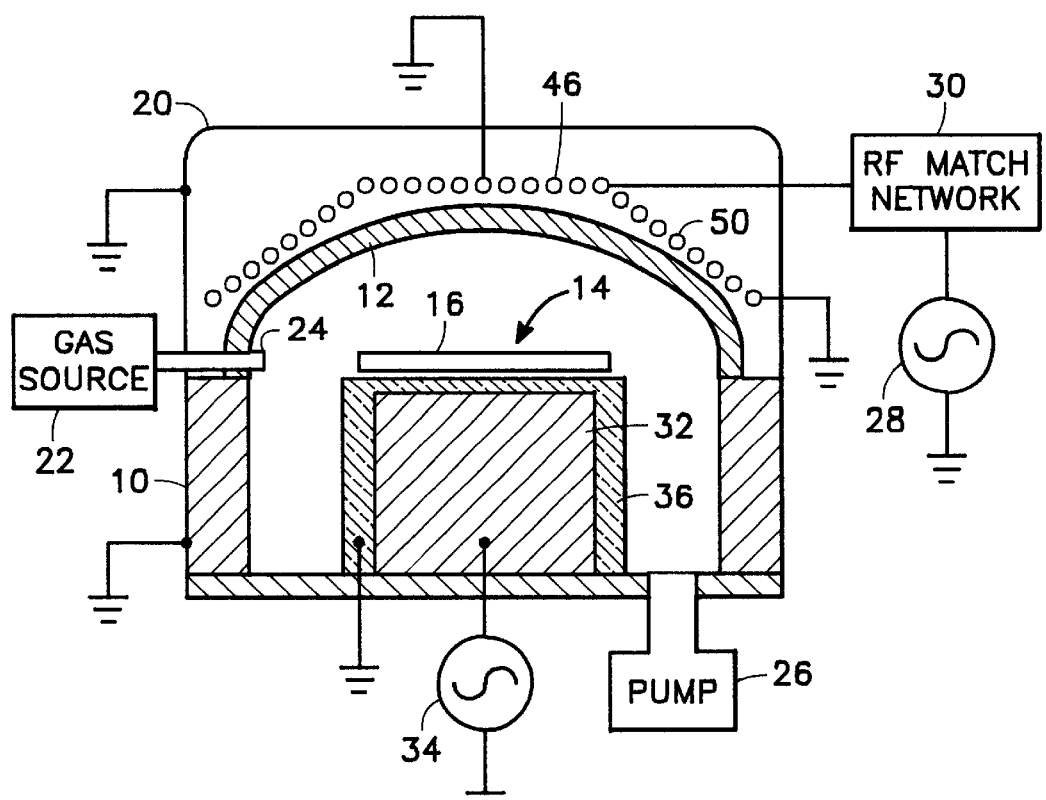
FIG. 8 is a simplified cut-away side view of an inductively coupled RF plasma reactor corresponding to a eighth embodiment of the invention.
Figure 9:
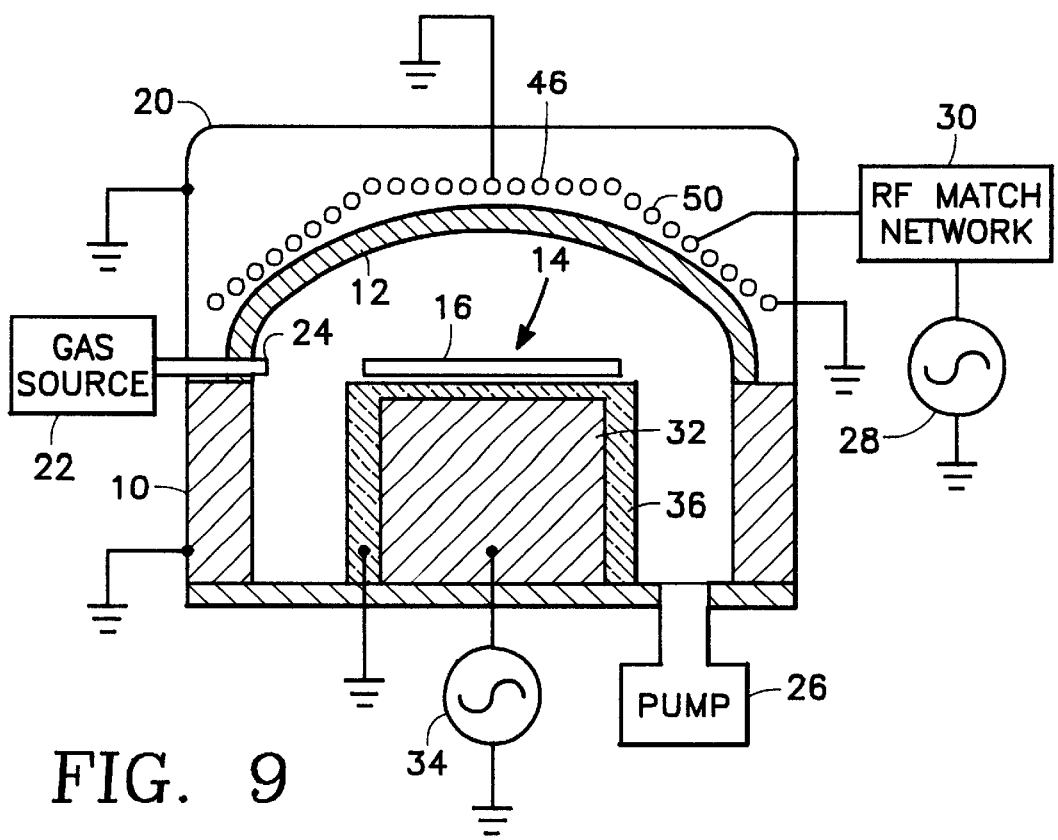
FIG. 9 is a simplified cut-away side view of an inductively coupled RF plasma reactor corresponding to a ninth embodiment of the invention.
Figure 10:
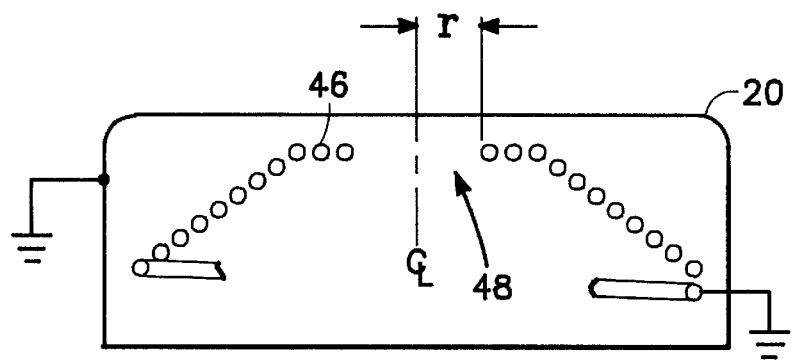
FIG. 10 is a simplified cut-away side view of an inductively coupled RF plasma reactor corresponding to a tenth embodiment of the invention.

FIG. 8 illustrates a second embodiment of the hybrid inductor consisting of the shallow top portion 46 and a conical side coil 50 corresponding to the conical coil inductor 40 of FIG. 3 in lieu of the cylindrical portion 44 of FIG. 5. As in the embodiment of FIG. 5, both portions 46, 50 of the coil are wound from the same continuous conductor and a single power source 28, 30 connected to the top winding 50a energizes the whole coil inductor. FIG. 9 illustrates how the power source 28, 30 may be connected to a winding other than the top winding 50a, as in FIG. 6. FIG. 10 illustrates how a center opening 48 may be provided in the top coil portion 46 in combination with the comical side coil 50.

Figure 11:
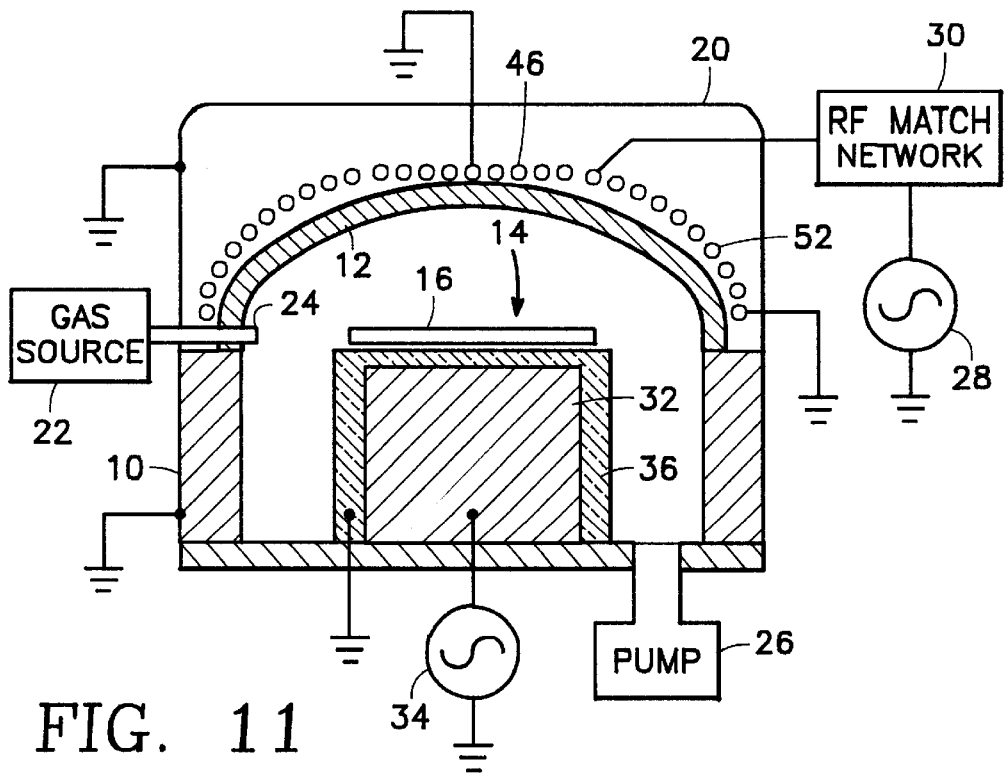
FIG. 11 is a simplified cut-away side view of an inductively coupled RF plasma reactor corresponding to an eleventh embodiment of the invention.

FIG. 11 illustrates a third embodiment of the hybrid coil inductor of the invention in which the cylindrical side portion 44 or the conical side coil 50 are replaced by a curved-section (e.g., dome) shaped coil 52, with the power source 28, 30 being connected to the outermost winding 46a of the top portion 46. As in FIG. 5, both coil portions 46, 52 are continuously wound from the same conductor and energized with one power source 28, 30. In FIG. 11, the center or top coil portion 46 is the most shallow while the side or bottom coil portion 52 is the steepest, the top coil portion most closely conforming with the shallow shape of the center of the multi-radius dome ceiling 12, this conformality diminishing radially away from the center. In an alterative embodiment, the entire coil inductor 46, 52 may be of exactly the same shape as the ceiling 12 for complete conformality.

Figure 12:
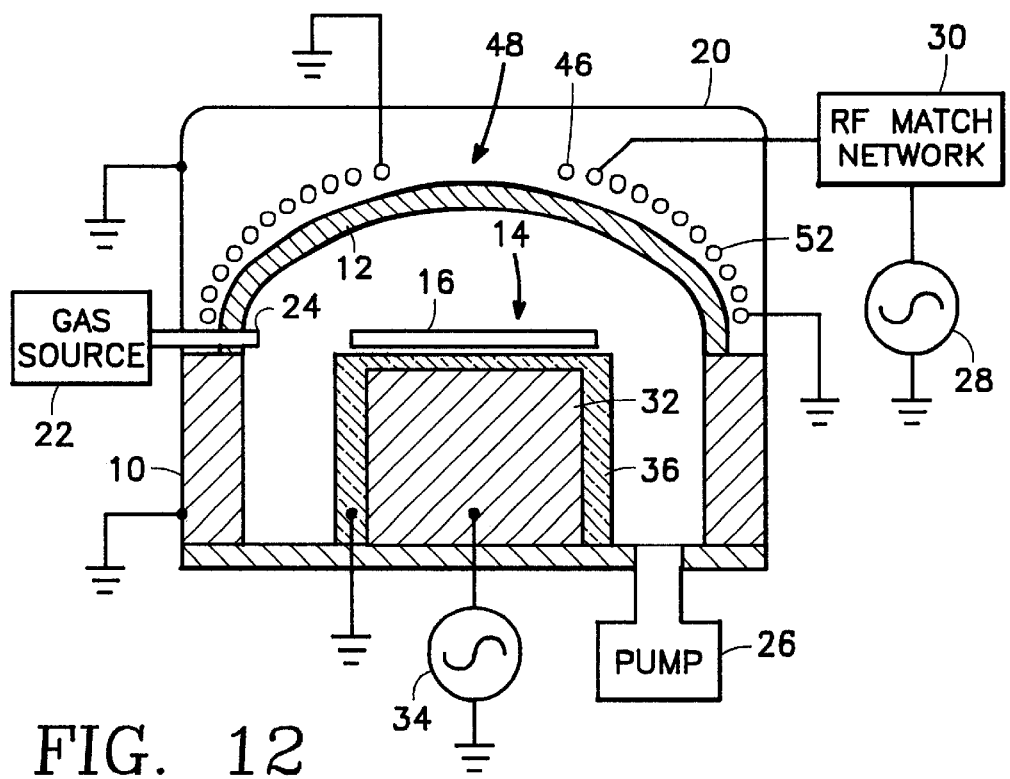
FIG. 12 is a simplified cut-away side view of an inductively coupled RF plasma reactor corresponding to an twelfth embodiment of the invention.

FIG. 12 illustrates how the opening 48 in the top portion 46 may be combined with the curved-section side coil 52. In embodiments such as that of FIG. 12 in which the conductor (coil inductor 52 or capacitive electrode of the same shape) is at least nearly conformal with the dome ceiling, the ion current density tends to be higher near the wafer center and therefore undesirably nonuniform, provided that the highest part of the ceiling (the center) is at least 75 cm (3 in.) above the wafer. (A lesser height, such as 50 cm or less, causes the ion current density near the wafer center to be lower than at other portions of the wafer due to recombination effects near the ceiling.) The problem of excessive ion current density at the wafer center is solved by the aperture 48 because the aperture 48 reduces the ion current density at the wafer center to a level which is generally uniform with the ion current density around the remainder of the wafer, depending upon the radius of the aperture 48. Preferably, for example, a 50 cm diameter chamber for processing a 30 cm diameter wafer with a nearly conformal conductor (e.g., coil inductor) as that illustrated in FIG. 12 would require the aperture 48 to be in the range of 15 cm to 25 cm in diameter in order to provide uniform ion current density across the wafer surface. As another example, a 35 cm diameter chamber for processing a 20 cm wafer would require the aperture 48 to be in the range of about 10 cm to 20 cm.

Implementations of the embodiment of FIG. 12 in which the coil inductor 52 is conformal with the ceiling 12 readily ignite the plasma. In comparison, although the non-conformal embodiments such as the conical coil inductor of FIG. 4 less readily ignite a plasma, they better suppress sputtering near the lower ceiling corner, as discussed above. Therefore, at plasma source power levels above 2000 Watts, the embodiment of FIG. 4 is preferred while at plasma source power levels below 2000 Watts the embodiment of FIG. 12 (with a ceiling-conformal coil shape and aperture) is preferred.

Figure 13:
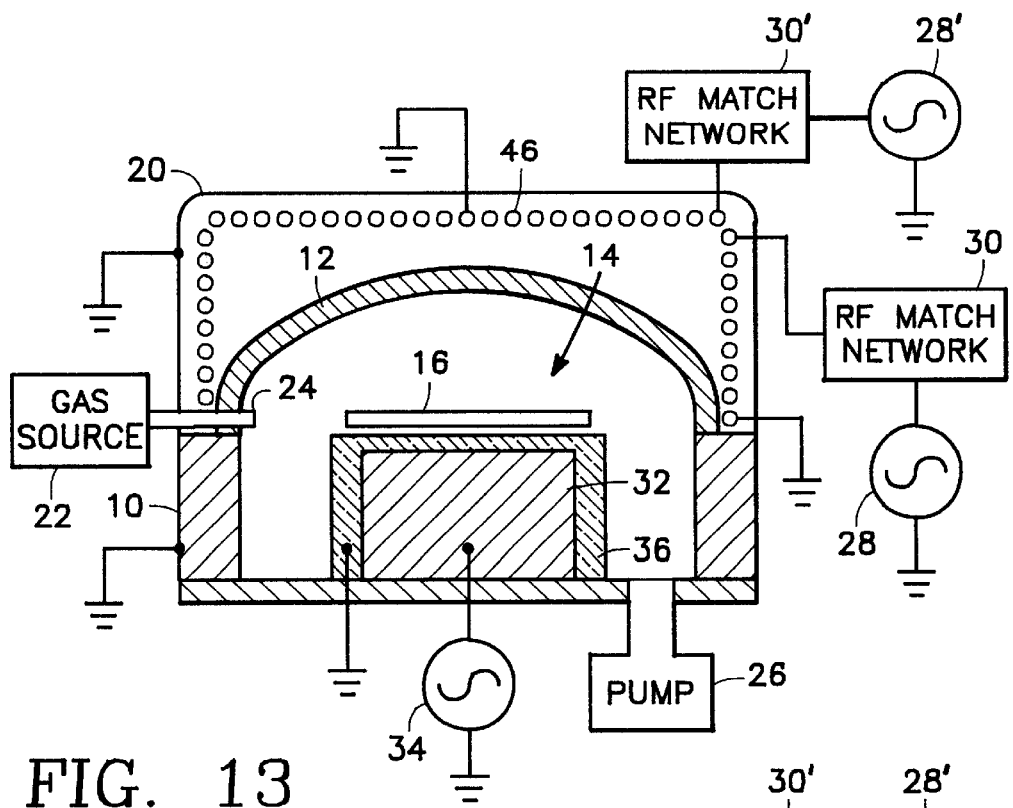
FIG. 13 is a simplified cut-away side view of an inductively coupled RF plasma reactor corresponding to an thirteenth embodiment of the invention.
Figure 14:
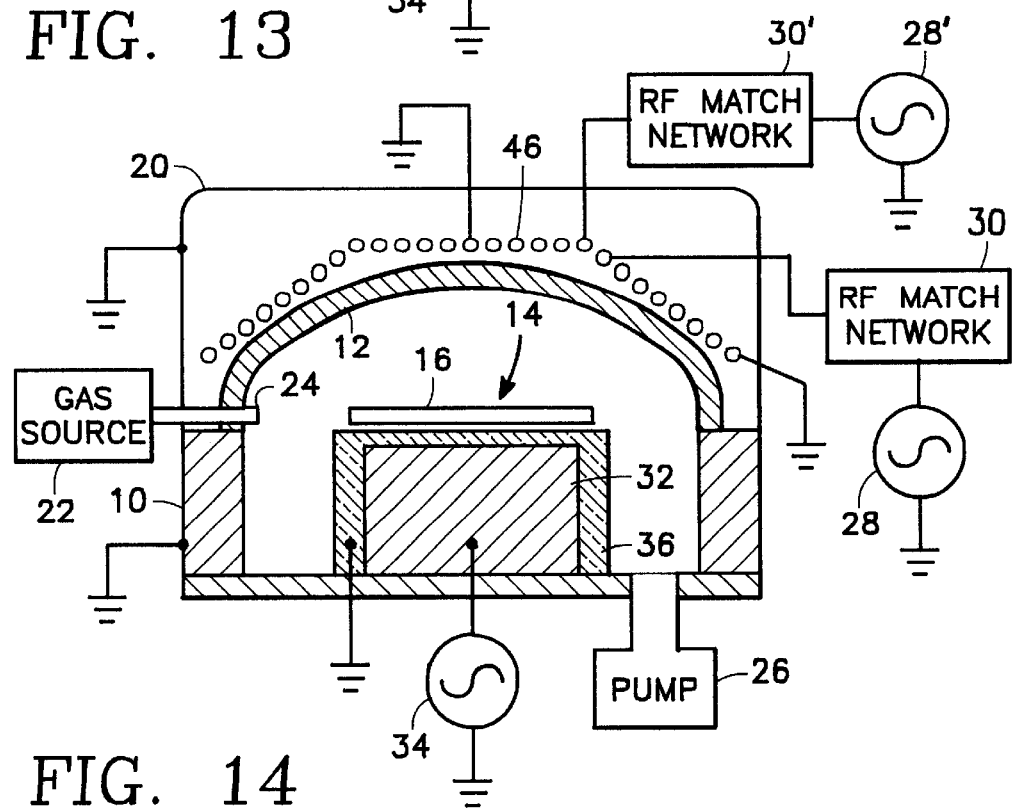
FIG. 14 is a simplified cut-away side view of an inductively coupled RF plasma reactor corresponding to an fourteenth embodiment of the invention.
Figure 15:
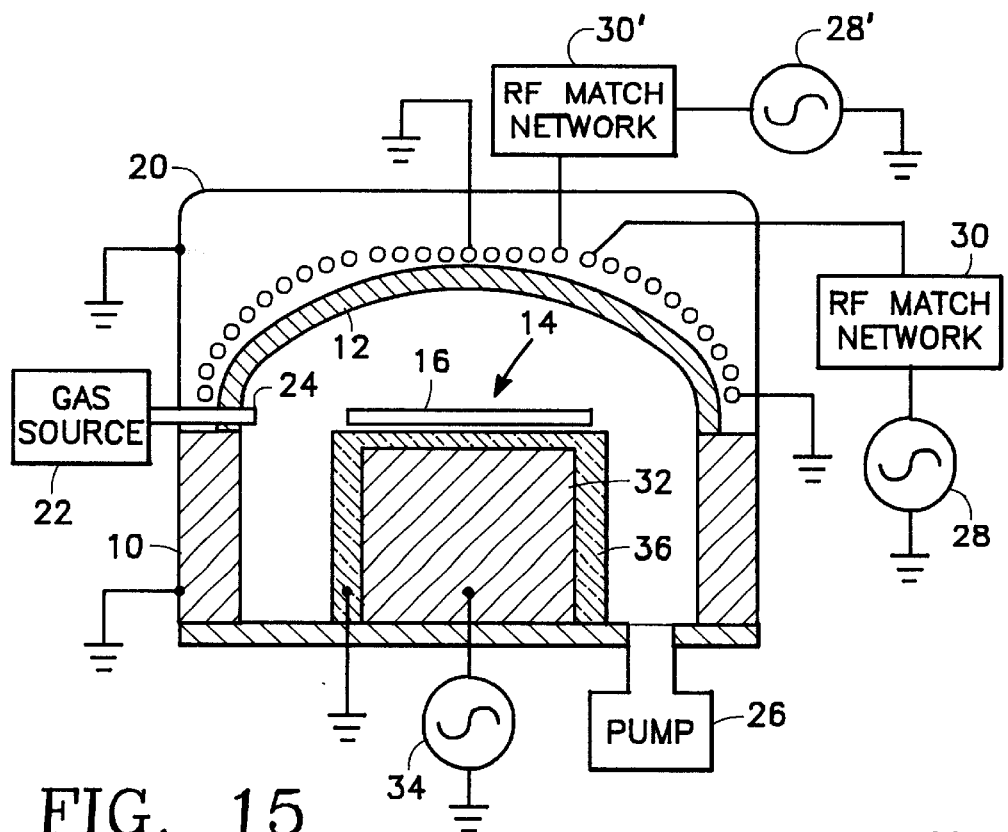
FIG. 15 is a simplified cut-away side view of an inductively coupled RF plasma reactor corresponding to an fifteenth embodiment of the invention.

FIG. 13 illustrates how the embodiment of FIG. 5 may be modified by electrically separating the portions 44, 46 of the unitary coil and energizing each coil portion 44, 46 with separately controllable independent RF power sources 28, 30 and 28', 30'. This feature has the advantage that the plasma ion density in the wafer center may be controlled relative to the plasma ion density elsewhere by changing the power output of one of the power sources 30, 30' relative to the other. FIGS. 14 and 15 illustrate how the same modification may be made to the embodiments of FIGS. 8 and 11 respectively.

The dual power supply embodiments of FIGS. 13–15 may be used to reduce, if desired, the plasma ion density at the wafer center by increasing the power to the flat top portion of the coil from RF source 28', 30' or decreasing it in the case of insufficient plasma ion density at the wafer center. Further adjustments of the power input are possible to bias the pedestal and substrate, relative to the power inputs to the coil portions.

Figure 16:
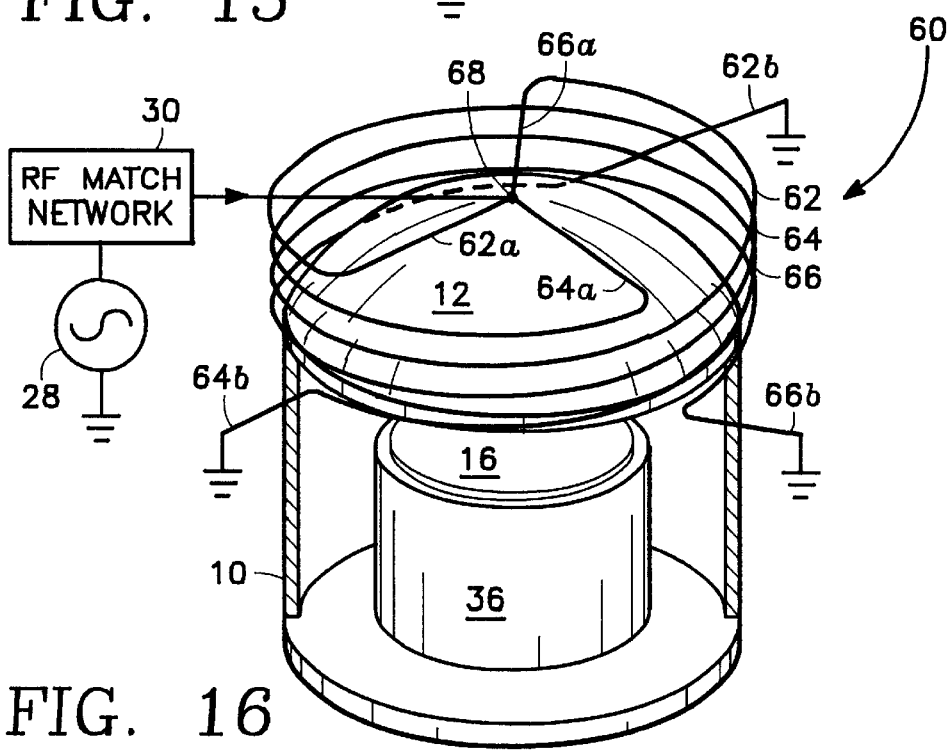
FIG. 16 illustrates an embodiment corresponding to FIG. 1 employing a coil inductor consisting of multiple concentric spiral conductors.

Referring to FIG. 16, the cylindrical coil inductor 18 of FIG. 1 may be replaced by a multiple spiral coil inductor 60 consisting of plural (e.g., three) concentric spiral conductors 62, 64, 66 connected to a common apex 68 by respective straight conductors 62a, 64a, 66a. The RF match network 30 is connected to the apex 68 while the ends 62b, 64b, 66b of the spiral conductors 62, 64, 66 are connected to ground. Preferably, the spiral conductors 62, 64, 66 are of equal lengths so that the ends 62b, 64b, 66b are equilaterally spaced about an arc. Such a multiple spiral coil inductor is disclosed in U.S. patent application Ser. No. 08/332,569 filed Oct. 31, 1994 by Xue-Yu Qian et al. entitled "INDUCTIVELY COUPLED PLASMA REACTOR WITH SYMMETRICAL PARALLEL MULTIPLE COILS HAVING A COMMON RF TERMINAL" and assigned to the present assignee.

Figure 17:
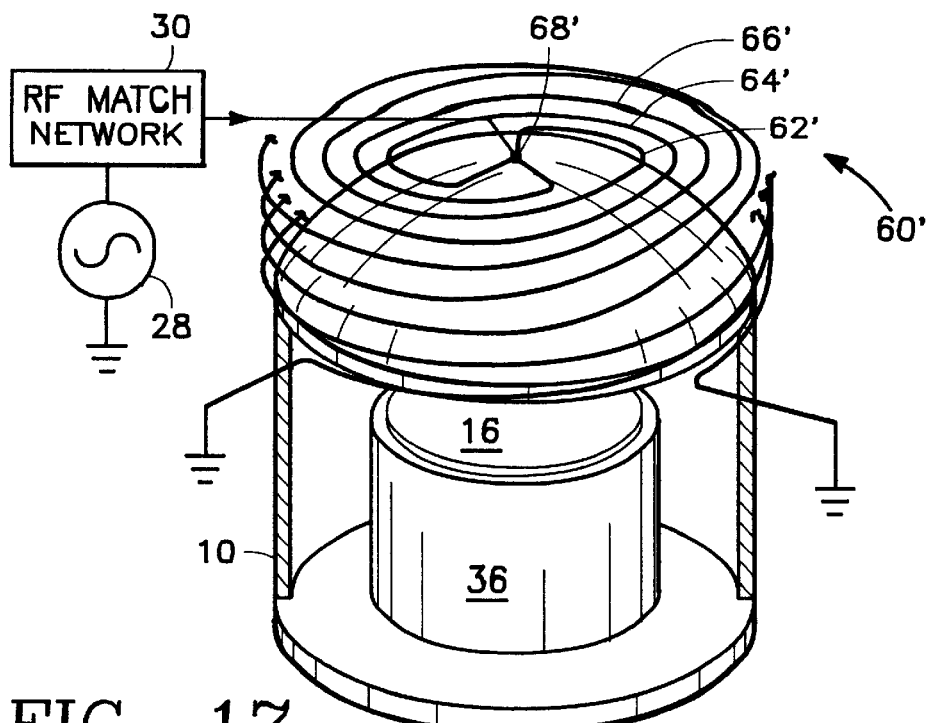
FIG. 17 illustrates an embodiment corresponding to FIG. 5 employing a coil inductor consisting of multiple concentric spiral conductors.
Figure 18:
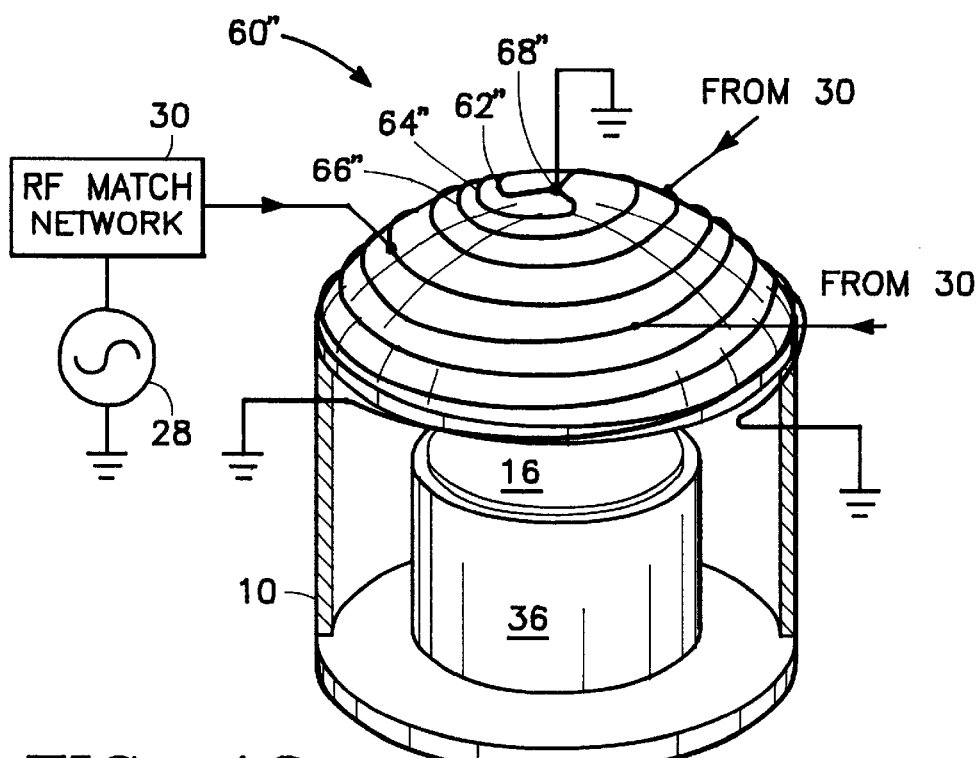
FIG. 18 illustrates an embodiment corresponding to FIG. 11 employing a coil inductor consisting of multiple concentric spiral conductors.

Referring to FIG. 17, the right-cylinder shaped coil inductor 42 of FIG. 5 may also be replaced by a multiple spiral coil inductor 60' like that of FIG. 16. In FIG. 17, the multiple spirals continue from the outer circumference of the multiple spiral coil inductor 60' to the apex 68.

Referring to FIG. 13, the dome-shaped coil inductor of FIG. 11 may be replaced by a dome-shaped multiple spiral coil inductor 60" consisting of plural (e.g., three) concentric spiral conductors 62", 64", 66" connected at a common apex 68". In one variation generally applicable to multiple spiral coil inductors disclosed herein, the apex 68" and the ends of all multiple spiral conductors 62", 64", 66" are grounded while the RF match network 30 is connected to mid-points along each of the multiple spiral conductors 62", 64", 66" (similar to the mirror-coil configurations of FIGS. 2, 4, 6, 8, 9 and 11, for example). This divides each multiple spiral conductor 62", 64", 66" into two sections, although the number of sections may be greater than two. For two sections, the sections are mirror coils. For this purpose adjacent sections are oppositely wound (wound in opposite directions) so that the magnetic fields from all sections add constructively, as described in both the above referenced applications by Yen et al, and by Qian et al. This illustrates how any embodiment employing multiple spiral coil inductors may be modified in accordance with a mirror coil configuration to provide multiple coil sections, as described in detail in the above-referenced application by Xue-Yu Qian et al.

Figure 19:
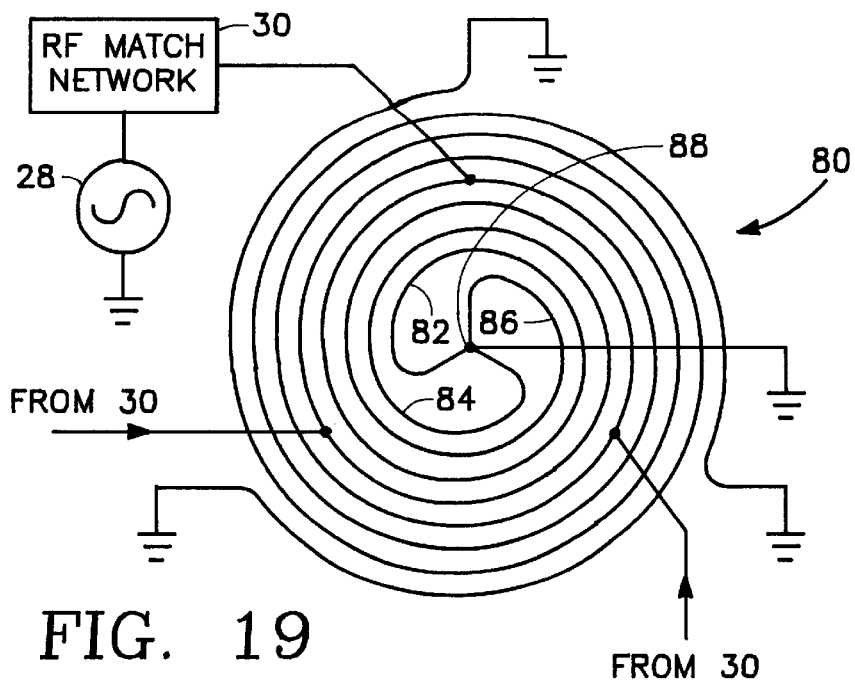
FIG. 19 illustrates an embodiment corresponding to FIG. 14 employing a coil inductor consisting of multiple concentric spiral conductors.
Figure 20:
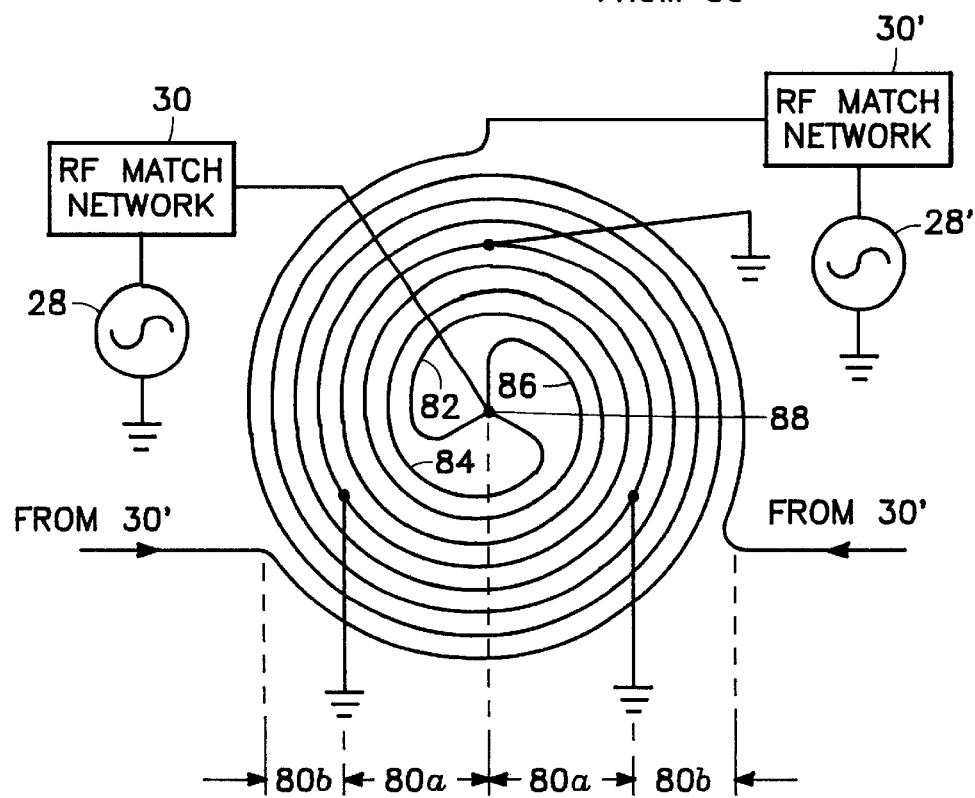
FIG. 20 illustrates a modification of the embodiment of FIG. 19 in which different portions of the inductor are powered independently.

Referring to FIG. 19, the truncated conical coil inductor 46 of FIG. 14 may be replaced by a multiple spiral coil inductor 80 of the same shape consisting of plural (e.g., three) concentric spiral conductors 82, 84, 86 connected at a common apex 88. Referring to FIG. 20, as yet another modification applicable to any of the multiple spiral coil inductors disclosed herein, the coil inductor 80 is divided into two separately powered sections, a top section 80a and a bottom section 80b. The two sections 80a, 80b are powered independently by separately controllable RF generators 28, 28' and RF match networks 30, 30', respectively. In yet a further modification, eliminating the upper portion 80a provides an inductor (80b) having a central aperture as in the embodiments of FIGS. 10 and 12 described previously herein. In this manner both the benefits of optimizing control over many other plasma-related factors may be obtained simultaneously.

In summary, the embodiments of FIGS. 1 through 20 generally include an arcuate-shaped non-conductive or dielectric ceiling 12 which may be a dome and preferably a multiple-radius dome supported in facing spaced overlapping relationship with the wafer pedestal 32, 36. The central portion of the ceiling 12 is centered relative to the coil inductor 18 and relative to the wafer pedestal 32, 36 and has the largest radius and the peripheral or circumferential portion of the ceiling 12 has the smallest radius, so that the central portion overlying the center of the wafer pedestal 32, 36 is the most shallow or flattest and constitutes a substantial fraction of the diameter of the ceiling 12 while the remaining peripheral portion is the steepest or most curved. Preferably, the inductor 18 is a wound coil preferably wound in a multi-radius shape as in FIGS. 11 or 12, but ranging between the right cylinder shape of FIGS. 1 and 2 to the planar shape of the top portion 46 of the coil inductors of FIGS. 5–14, the preferred conical and multi-radius shapes lying within this range. The preferred multi-radius coil inductors 52 of FIGS. 11 and 12 are either conformal with the multi-radius curvature of the ceiling 12 (as in FIG. 12) are non-conformal (as in FIG. 11). In fact, all of the embodiments except that of FIG. 12 have coil inductors whose shapes are non-conformal with the multi-radius dome-shaped ceiling 12. In general, for a non-conformal coil inductor, the inductor (e.g., the multi-radius inductor 52 of FIG. 11) has at least one zone of an intermediate radius (from the center of inductor) which is axially spaced from the ceiling 12 to a greater degree than other zones (e.g., the center portion 46) of the inductor, as is the case with the embodiments of FIGS. 5–9 and 12. In the case of the preferred multi-radius inductor 52, the central portion (e.g., the central portion 46 of FIG. 11) of the inductor is most nearly flat and is closest to the ceiling 12, and has a maximum radius of curvature at its center (46) and a minimum radius of curvature at is periphery. If there are only two radii of curvature of the multi-radius inductor, then the maximum radius of curvature extends to an intermediate portion inward from the periphery while the minimum radius of curvature extends from the periphery to the intermediate portion. Alternatively, it is desirable for there to be many radii progressing monotonically from the maximum at the center to the minimum at the periphery of the inductor. In preferred embodiments such as the embodiments of FIGS. 7, 10, 12 and 20, the inductor defines a central aperture or hole (e.g., the hole 48 of FIG. 10), which has the advantage of providing a way of sculpting the plasma density by reducing the radiated RF power at the center of the inductor. This feature is particularly complementary to the embodiments of FIGS. 5–15 having central flat inductor portions 46.

Of the foregoing feature, each may be suitably combined with other of these features and each may be exaggerated or minimized to achieve a multi-faceted sculpting of the spatial distribution of plasma density. Specifically, many useful coil shapes for optimizing plasma density distribution will be non-conformal relative to the ceiling shape, in that an intermediate radial zone of the coil shape will be spaced away from the ceiling surface in the axial direction to a greater degree than those portions of the coil nearest the center of the ceiling (as in FIG. 11, for example). An advantage is that sputtering of the ceiling is reduced where this spacing is significant near the bottom corner of the ceiling.

Figure 21:
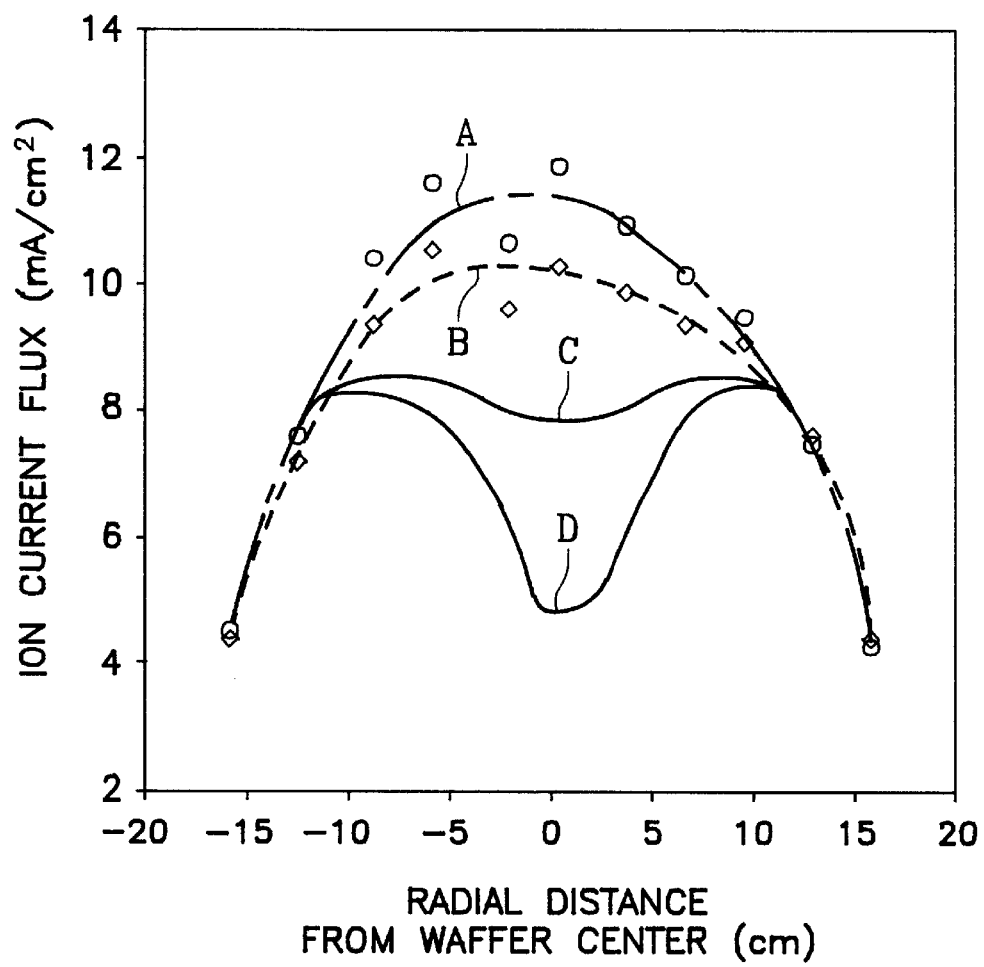
FIG. 21 is a graph of experimental data comparing the spatial distributions of plasma ion flux density for a coil inductor conformal with the dome ceiling and for a right cylinder coil inductor.

The graph of FIG. 21 illustrates how adjusting the shape of the coil inductor adjusts the plasma ion density spatial distribution. The vertical axis is the plasma ion density while the horizontal axis is the radial distance from the wafer center. The data points denoted by the empty circle symbols represent experimental data obtained with a coil inductor conforming the with the multiple radius dome ceiling. The data points denoted by solid diamonds denote experimental data obtained with a right cylinder-shaped coil inductor. The graph of FIG. 20 shows that the right cylinder-shaped coil inductor provides a flatter ion density distribution compared with that obtained with the conformal (dome-shaped) coil inductor.

With the multi-radius dome ceiling, the chamber pressure may be varied to sculpt the ion current distribution across the wafer surface. Specifically, in order to correct for excessive ion current density at the wafer center, the pressure should be increased, while the pressure should be decreased to correct inadequate ion current density at the wafer center. For example, in the case of a conformal coil as in FIG. 12 with a 10 cm quartz dome ceiling and applied plasma source power of 1500 Watts, the ideal chamber pressure is on the order of about 10 mTorr for optimizing ion current distribution uniformity.

Similarly, the applied plasma source power (e.g., from the RF source 28) may be varied to sculpt the ion current distribution across the wafer surface. Specifically, in order to correct for excessive ion current density at the wafer center, the RF power should be decreased, while the RF power should be increased to correct inadequate ion current density at the wafer center. For example, in the case of a conformal coil as in FIG. 12 with a 10 cm quartz dome ceiling and applied plasma source power of 1500 Watts, the ideal RF power level from the RF source 28 is on the order of about 1500 Watts for optimizing ion current distribution uniformity.

While the invention has been disclosed with reference to application in metal etch plasma reactors, it is also useful with plasma reactors for performing semiconductor (silicon) etch, dielectric (e.g., silicon dioxide) etch, chemical vapor deposition, physical vapor deposition and the like.

Each one of FIGS. 1–20 illustrates how the plasma reactor chamber is irradiated with plasma source RF power by a conductor overlying the chamber ceiling and having a particular shape conforming with a three dimensional surface such as a cone, cylinder or dome. While each of these figures shows how that conductor may be a coiled inductor, it should be understood that the conductor may instead be a capacitive electrode of the same shape (same three dimensional surface). In either case, the pedestal 36 is not necessarily connected to an RF bias source, and preferably is not so connected in the case in which the conductor is a capacitive electrode rather than a coil inductor.

Regime of Inductive Coil and Dome Ceiling Heights

The dome-shaped ceiling provides the advantage that the plasma discharge near the wafer edge is enhanced as compared with that experienced with a flat ceiling, so that plasma ion density is more uniform across the wafer. This is because ionization and recombination are affected by the proximity of the ceiling, and the dome-shaped ceiling is further from the wafer center and nearer the wafer edge as compared with a flat ceiling.

A multi-radius dome ceiling with a similarly shaped inductive coil has a closer distance between the center of the ceiling and the wafer as compared to a hemispherical dome. This provides a better plasma discharge control near the center zone of the dome and the plasma uniformity is better than that of the hemisphere.

In an inductively coupled plasma etch reactor of the following embodiment, ion density uniformity is improved, ion energy is better controlled and device damage is optimized, so that as a result etch profile control is enhanced, etch selectivity is improved and etch microloading is minimized. These results are achieved by adhering to an optimized coil-dome geometry including a particular dome apex height range relative to the dome base and a particular wafer position range relative to the dome apex. Different but related problems are overcome in this embodiment in enhancing etch selectivity, ion density uniformity, etch profile and source power efficiency while reducing ion damage, as follows.

1. Problems Relating to Etch Selectivity:

Etch selectivity is provided by depositing passivation species from the plasma onto wafer surfaces. For example, in etching a silicon dioxide layer over a polysilicon underlayer, passivation species including polymers accumulate more on polysilicon than on silicon dioxide, so that the polysilicon etches more slowly than the silicon dioxide, thus providing the desired etch selectivity. In silicon dioxide etch processes, the polymers are formed from fluoro-carbon gases in the plasma. In aluminum etch processes, the polymers are formed from, among other things, photoresist and other non-volatile species sputtered into the plasma from the wafer surface. The problem is that a flatter coil or one closer to the wafer center tends to increase local ionization at the wafer center, while enhancing deposition or formation of polymer near the wafer center. Without such polymer formation, etch selectivity is reduced or non-existent. Conversely, enhancing etch selectivity by reducing local ionization at the wafer center (by un-flattening the dome-shaped coil) reduces ion density at the wafer center, thereby degrading ion density uniformity.

2. Problems Relating to Etch Profile:

A vertical side-wall profile of etched features is provided by deposition of passivation species such as polymer on the vertical and horizontal etched surfaces and anisotropic removal of them from the horizontal surfaces by ion bombardment. For this purpose, ions in the plasma impinging on the wafer preferably travel in a vertical direction, so that their energy is concentrated on the horizontal surfaces and very little polymer is removed from the vertical surfaces. One problem is that an in-situ plasma source provides a strong dissociation and ionization of gases, but less recombination and passivation. A vertical etch profile is difficult to maintain, unless relatively high bias RF power is employed, which results in significant sputtering, low selectivity, etch profile microloading and wafer surface damage. A second problem is that the directionality of ions impinging on the wafer center is more random since there is less collimation by distance from the plasma source power to the wafer (e.g., the coil-to-wafer distance in an inductively coupled reactor). Again, a higher RF bias power is required to help collimate the ion flux, and this results in the problems discussed hereinabove.

3. Problems Relating to Ion Density Uniformity:

Moving the coil closer to the wafer to increase ion density at the wafer (by flattening the dome-shaped coil) at some point forces the ceiling so close to the wafer that recombination losses near the ceiling suppress ion density at the wafer center, as noted above. In addition, the ion density uniformity is very sensitive to chamber hardware perturbation.

4. Problems Relating to Ion Damage Control:

Ion bombardment damage at the wafer can be reduced by improving plasma ion distribution uniformity and decreasing the RF bias power applied to the wafer pedestal. This however reduces the vertical directionality of the ions and thereby degrades etch profile, as noted above. Increasing the source distance to increase ion collimation and improve passivation will reduce required RF bias power and minimize wafer damage.

5. Discovery of the Coil and Dome Ceiling Height Ranges:

FIGS. 22A, 22B, 22C and 22D illustrate a progression of multi-radius dome ceiling shapes from flattest to steepest, corresponding to the method of one embodiment for discovering the correct coil height and dome ceiling height, relative to the dome base, for enhancing etch selectivity, etch profile, ion damage control and ion density together. In FIG. 23, the curves labelled A, B, C and D illustrate the ion density radial distribution at the wafer surface corresponding to the reactors of FIGS. 22A, 22B, 22C and 22D, respectively.

The reactors in each one of FIGS. 22A–D have the following features in common: a ceiling 100 resting on a cylindrical side wall 105 of diameter D on the order of 13.64" surrounding a wafer pedestal 110 and a pumping annulus 115. An inductive coil 120 overlies and conforms with the ceiling 100 and extends from the periphery 100a of the ceiling part way toward the center, the coil 125 defining a center aperture 125 of diameter A on the order of about 8". A semiconductor wafer 130 of diameter d on the order of 6" rests on the wafer pedestal 110. The base of the dome shaped ceiling 100 (e.g., FIG. 22B) resting on the top of the cylindrical side wall 105 has a height h above the wafer 130. The apex of the dome shaped ceiling 100 has a height H above its base. Thus, the total height from the wafer to the dome-ceiling apex is H+h. A plasma source RF power supply 135 is applied to the coil 120 near its outer end, both ends of the coil 120 being grounded. A bias RF power supply 140 is connected to the wafer pedestal 110.

Figure 22A:
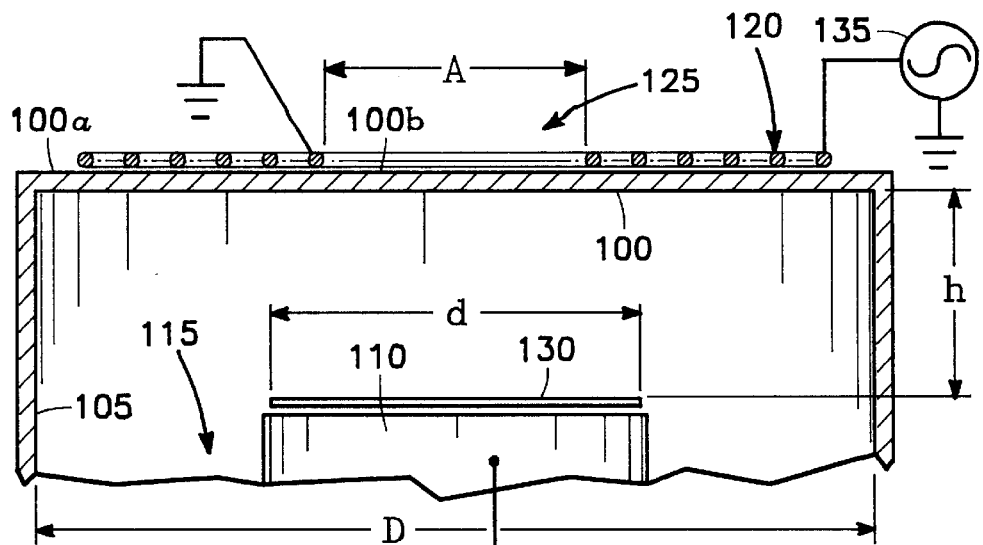
FIGS. 22A–22D illustrate a progression of RF plasma reactor shapes which differ from one another in accordance with the degree of flatness of a multi-radius dome-shaped ceiling.
Figure 23:
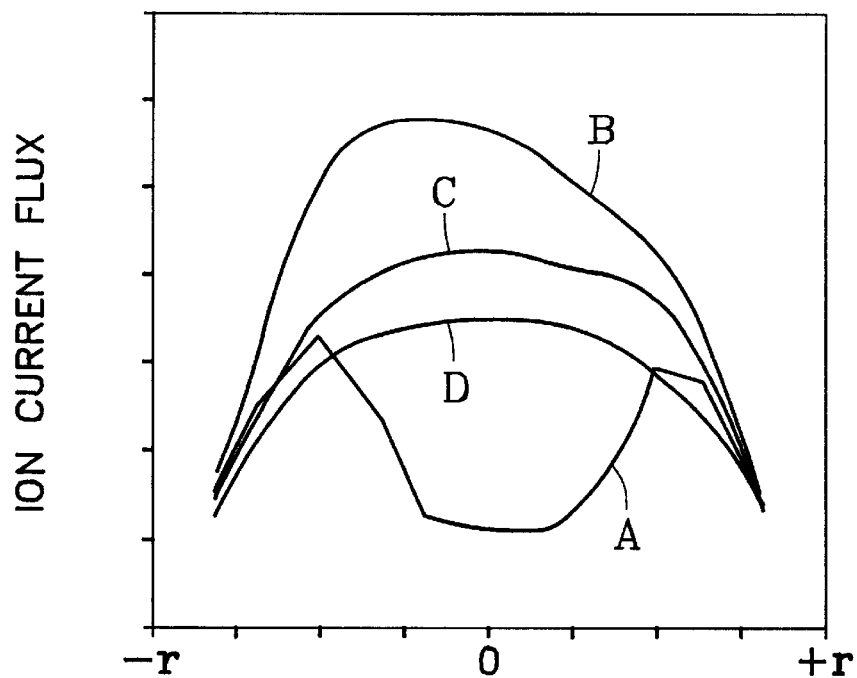
FIG. 23 is a graph of ion density as a function of radial position on a wafer in the reactor chamber, including curves corresponding to each of the examples of FIGS. 22A–22D.

In FIG. 22A, the ceiling 100 is at least nearly flat, and therefore recombination losses at the ceiling predominate over the wafer center. As a result, plasma ion density near the wafer center is very low, as indicated by the curve labelled A in FIG. 23.

Figure 22B:
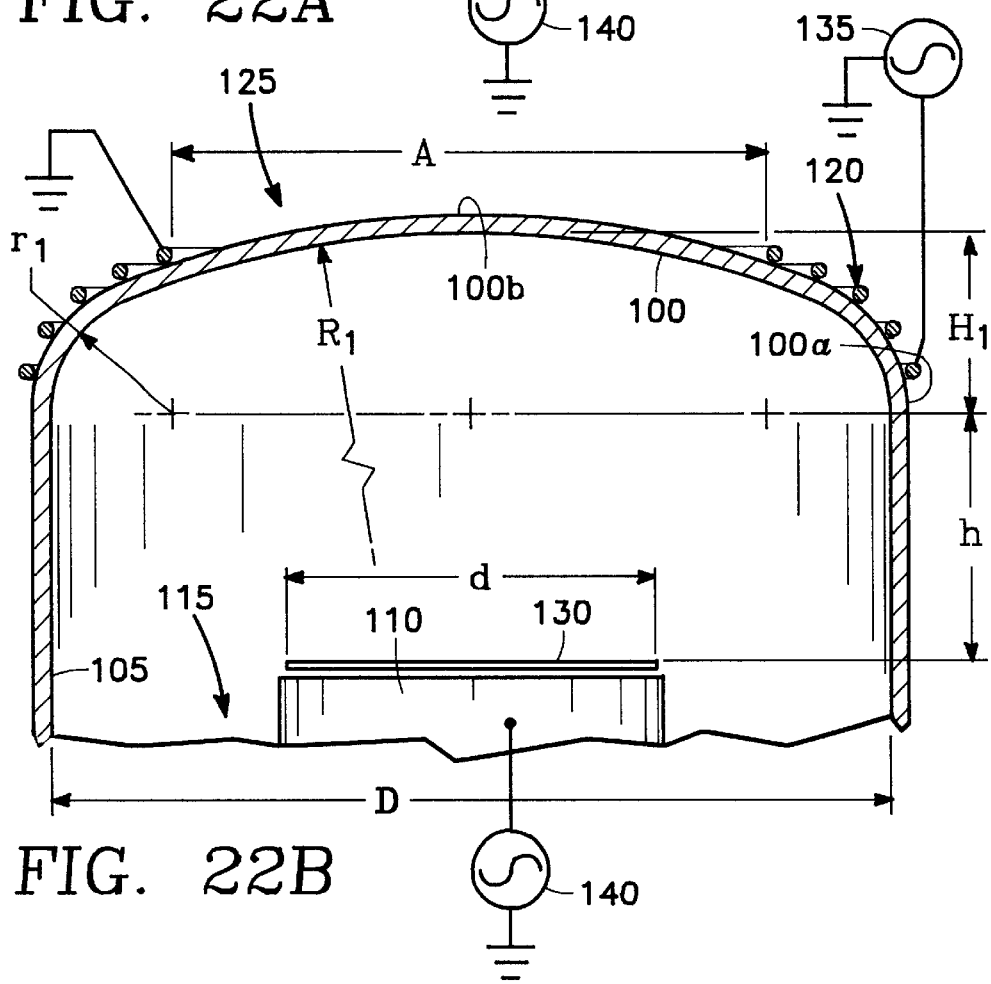

In FIG. 22B, the ceiling is less flat, corresponding to a shallow multi-radius dome shape, with a center radius R1 and a small corner radius r1 and height H1. Because the curvature of the dome-shaped ceiling 100 increases the distance of the ceiling 100 from the wafer center, recombination losses at the wafer center are negligible, as indicated by the curve labelled B in FIG. 23. In fact, with the elimination of recombination losses at the wafer center, the reactor of FIG. 22B provides the highest ion density. The disadvantage is that the ion density is non-uniform, there being a pronounced peak at the wafer center. The coil 120 is relatively close to the wafer center in FIG. 22B, so that formation of polymer is somewhat suppressed, leading to poor etch profile and etch selectivity. Moreover, the local ionization is so close to the wafer 130 that the directionality of ions impinging on the wafer surface is more random, further degrading etch profile.

Figure 22C:
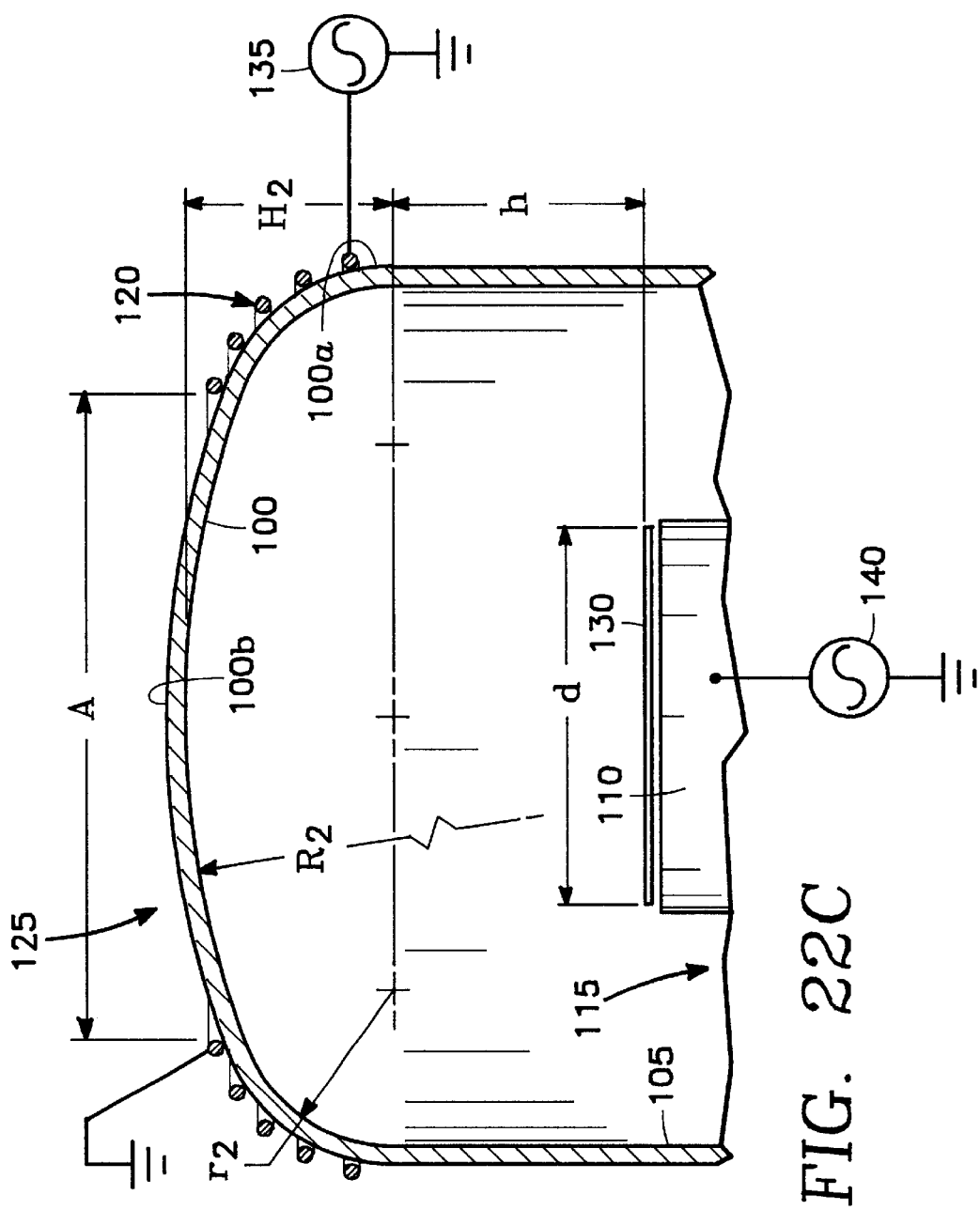

In FIG. 22C, the center radius R2 and corner radius r2 of the dome-shaped ceiling are such that the ceiling has a base-to-apex height H2 greater than H1, so that the coil to wafer distance is greater. As a result, polymer formation is not as suppressed and ion directionality is more vertical, leading to better etch profile and etch selectivity. However, the coil 120 is still sufficiently close to the wafer 130 that the ion density is relatively high, as indicated by the curve labelled C in FIG. 23.

Figure 22D:
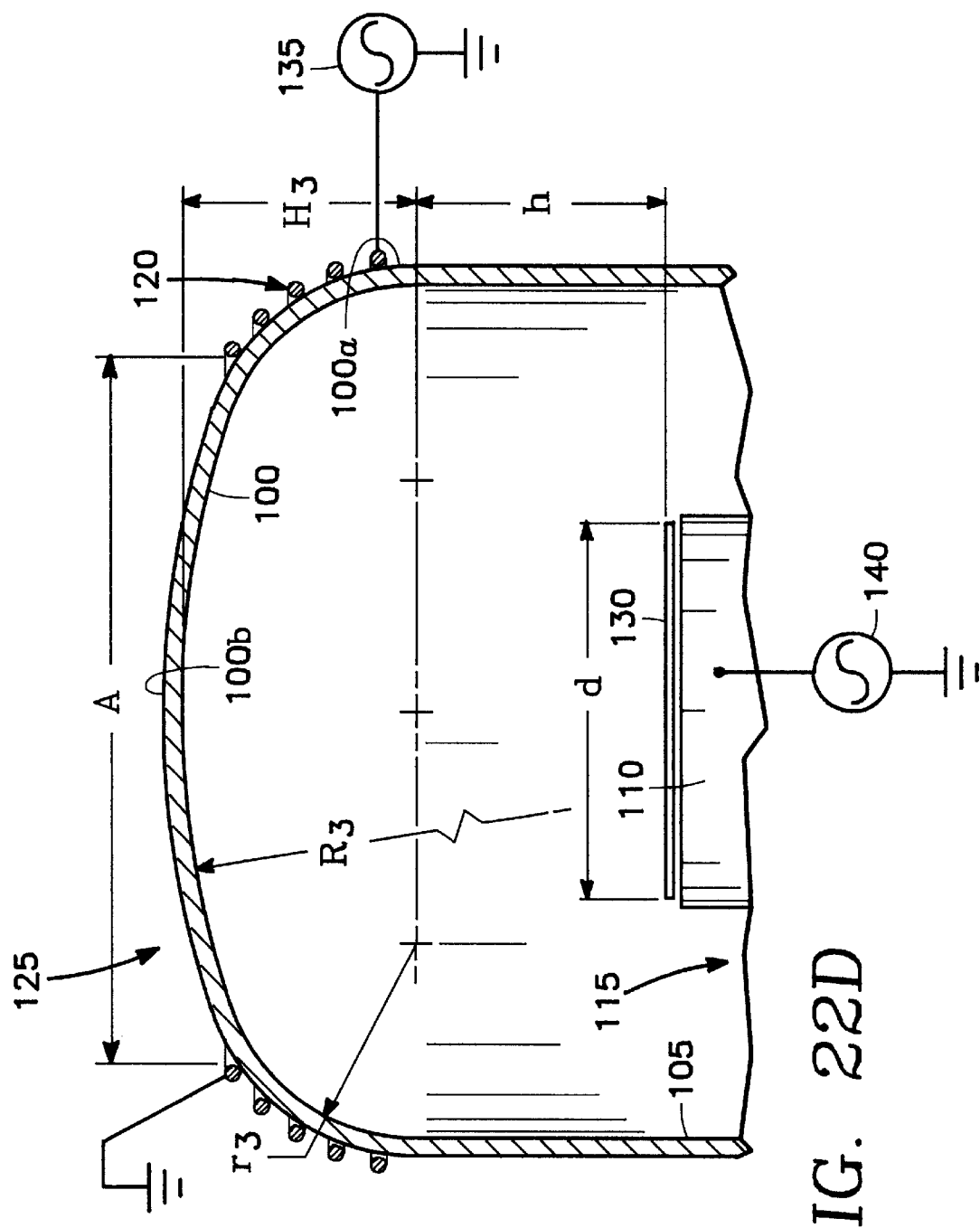

In FIG. 22D, the center radius R3 and corner radius r2 are such that the ceiling 100 has a base-to-apex height H3 greater than H2, so that the ion density at the wafer surface is less, as indicated by the curve labelled D of FIG. 23.

Table A sets forth the comparative dimensions of the embodiments of FIGS. 22A–D. It is a discovery of the invention that the foregoing problems are solved in the regime where R/r is between about 2 and 10, h is between about 1.5" and about 4" while H is between about 3" and about 6", and where the wafer-to-dome apex height H+h is between 6" and 7".

TABLE A

| FIG. | h | H | H + h |
|---|---|---|---|
| 22A | 2" | 0" | 2" |
| 22B | 2" | 3" | 5" |
| 22C | 2" | 4.7" | 6.7" |
| 22D | 2" | 5.5" | 7.5" |

Figure 25:
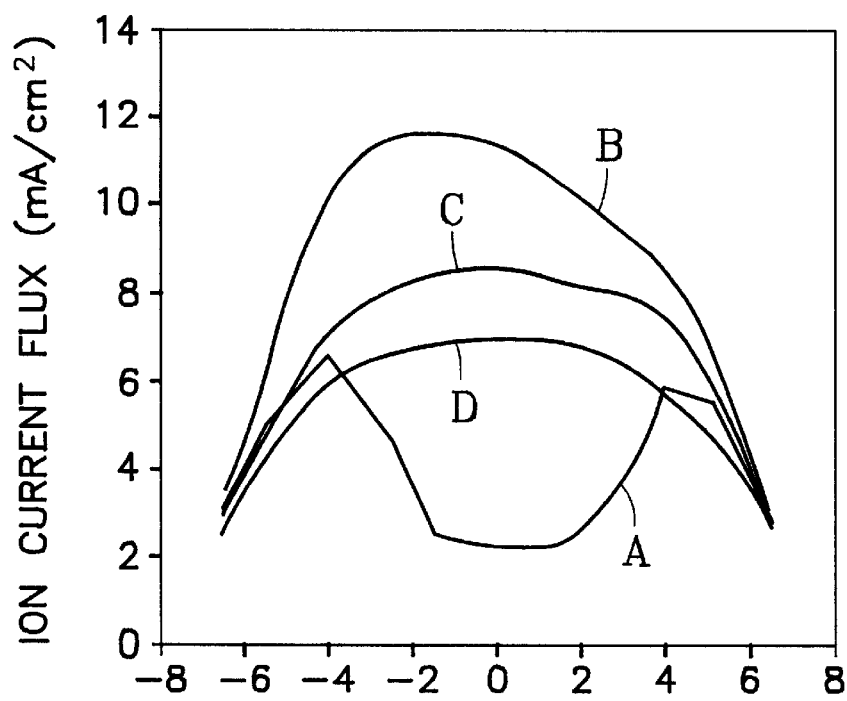
FIG. 25 is a graph of ion density as a function of radial position on a wafer in the reactor chamber, including curves corresponding to each of the examples of FIGS. 22A–22D.
Figure 24A:
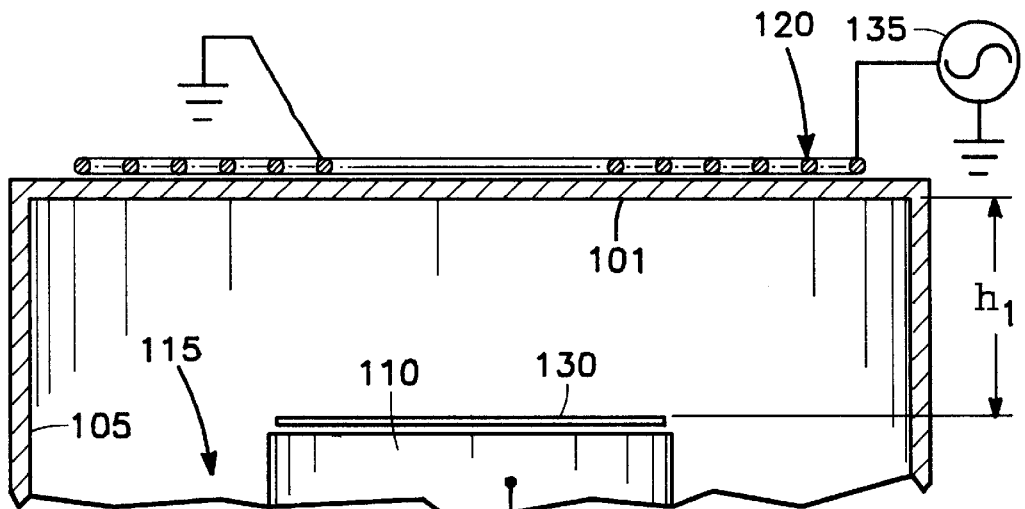
FIGS. 24A–24D illustrate a progression of RF plasma reactor shapes employing a multi-radius dome ceiling, the shapes differing from one another in accordance with the height of the chamber side wall.
Figure 24B:
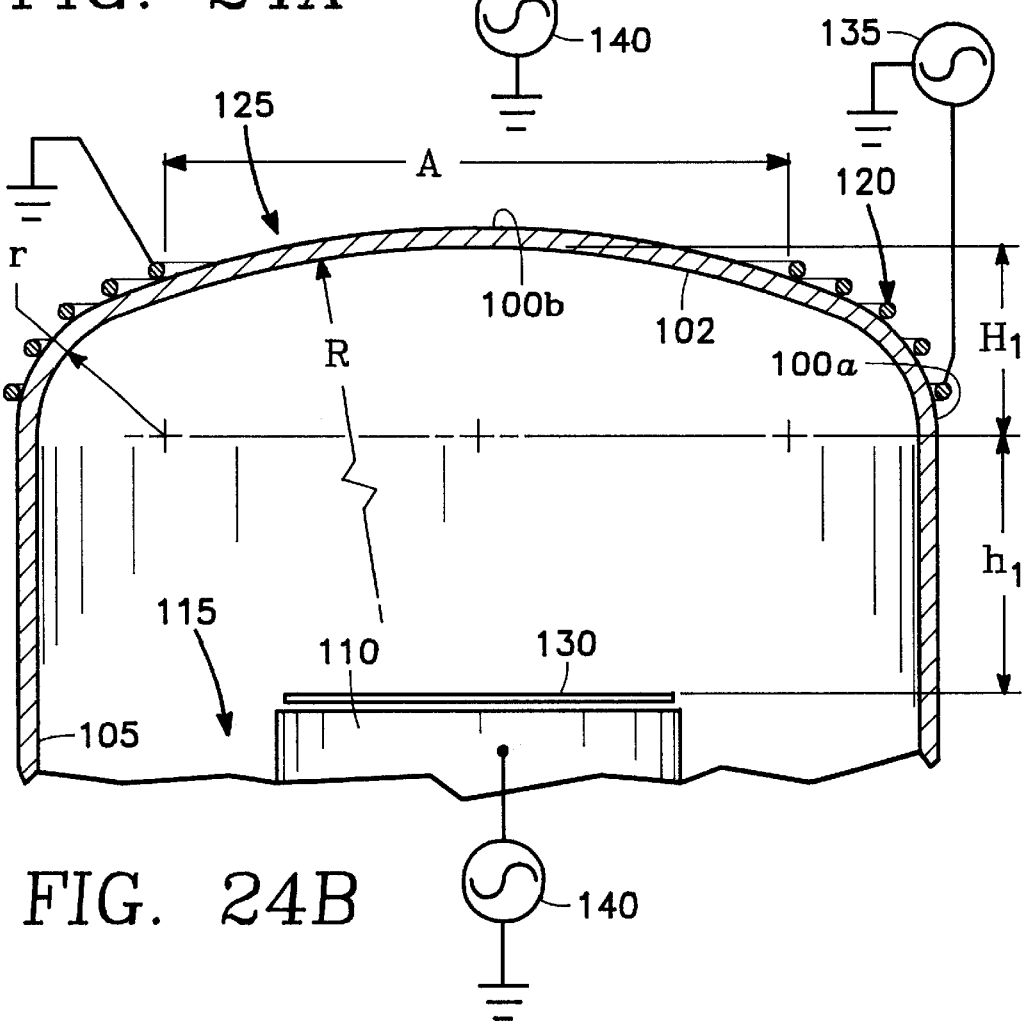
Figure 24C:
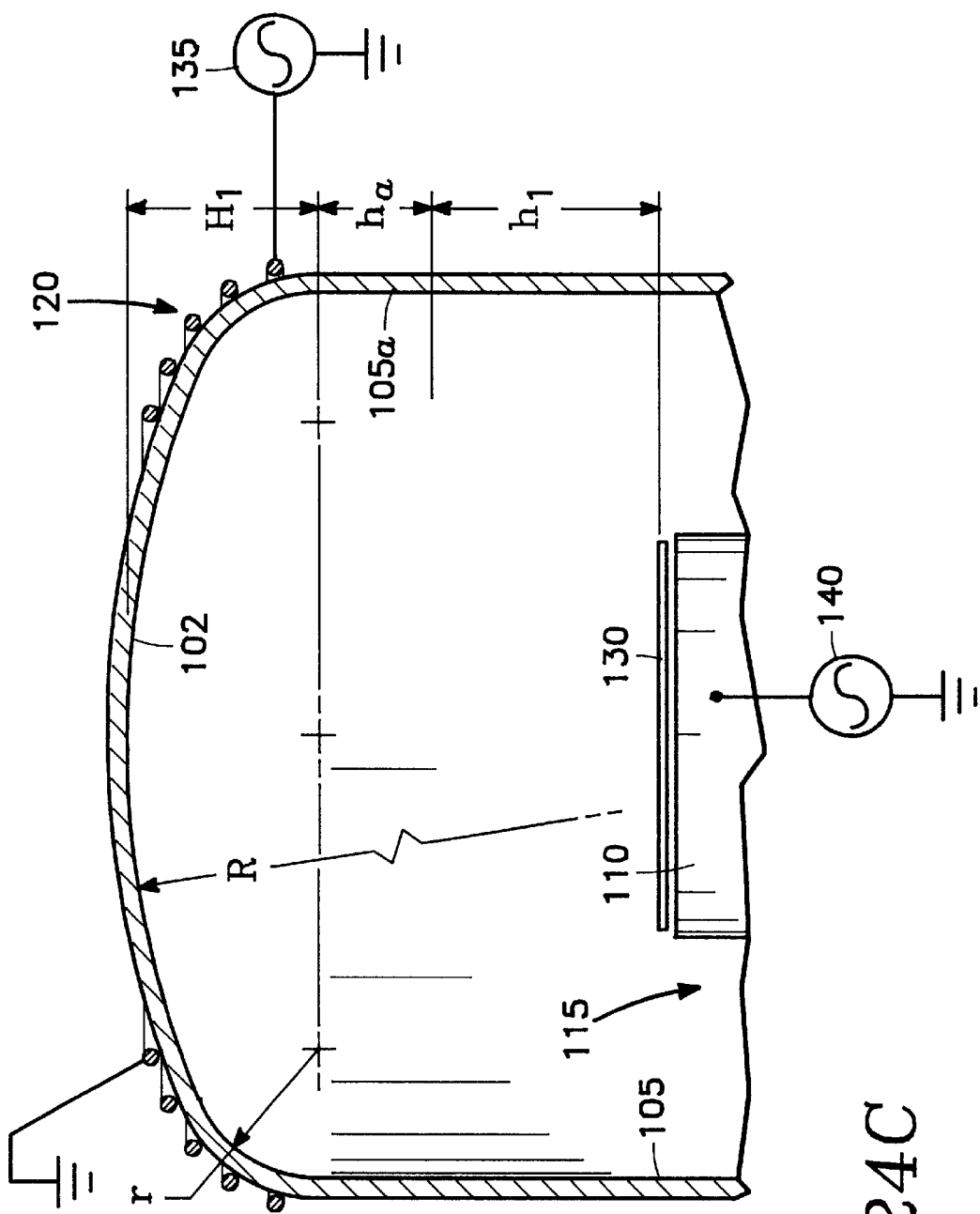
Figure 24D:
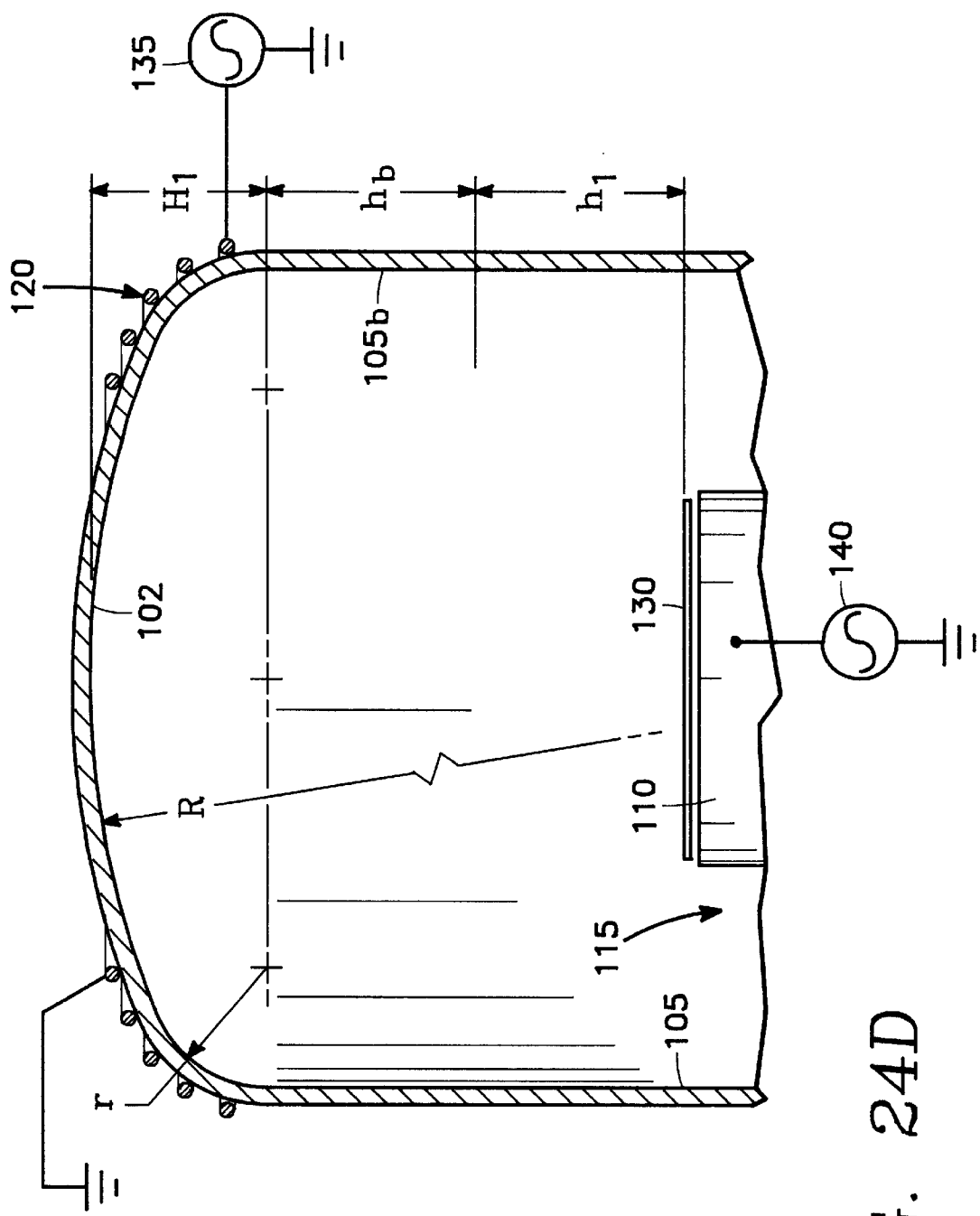

In the series of FIGS. 22A–22D, the results were varied by changing the curvature of the dome-shaped ceiling. Referring now to FIGS. 24A–24D, a similar progression in results may be obtained by changing the height of the cylindrical side wall 105. FIG. 24A illustrates a chamber similar to that of FIG. 22A having a flat ceiling 101 as a reference for comparison with results obtained in FIGS. 24B–24D. FIG. 24B illustrates the chamber of FIG. 24A modified in that a dome-shaped ceiling 102 is provided in lieu of the flat ceiling 101. FIG. 24C illustrates the chamber of FIG. 24B modified by adding a cylindrical 1-inch vertical spacer 105A between the cylindrical side wall 105 and the dome-shaped ceiling 102. FIG. 24D illustrates the chamber of FIG. 24B modified by adding an approximately 2-inch vertical cylindrical spacer 105B between the side wall 105 and the dome-shaped ceiling 102. Table B sets forth the values of the base-to-apex dome height H, the wafer-to-side wall top height h, the spacer height h', and the total wafer-to-ceiling height HT for the embodiments of FIGS. 24A–24D. Ion density distributions across the wafer surface measured with the embodiments of FIGS. 24A–24D are illustrated in the graph of FIG. 25 by the curves labelled A, B, C and D, respectively.

TABLE B

| FIG | H | h | H + h | Source Pwr | Bias Power |
|---|---|---|---|---|---|
| 24A | 0" | 1.95" | 1.95" | | |
| 24B | 2.95" | 1.95" | 4.90" | 800 W | 220 W |
| 24C | 2.95" | 2.95" | 5.90" | 1200 W | 200 W |
| 24D | 2.95" | 3.83" | 6.80" | 1200 W | 190 W |

In FIG. 24A, the ceiling 101 is at least nearly flat, and therefore recombination losses at the ceiling predominate over the wafer center. As a result, plasma ion density near the wafer center is very low, as indicated by the curve labelled A in FIG. 25.

In FIG. 24B, the ceiling 102 has a multi-radius dome shaped, with a center radius R1 on the order of 14.7 inches and a smaller corner radius r1 in the range of about 2 inches and height H. Because the curvature of the dome-shaped ceiling 102 increases the distance of the ceiling 102 from the wafer center, recombination losses at the wafer center are negligible, as indicated by the curve labelled B in FIG. 25. In fact, with the elimination of recombination losses at the wafer center, the reactor of FIG. 24B provides the highest ion density. The disadvantage is that the in density is non-uniform, there being a pronounced peak at the wafer center. The coil 120 is relatively close to the wafer center in FIG. 24B, so that formation of polymer is somewhat suppressed, leading to poor etch profile and etch selectivity. Moreover, the local ionization is so close to the wafer 130 that the directionality of ions impinging on the wafer surface is more random, further degrading etch profile. The inferior etch profile obtained in this embodiment provides results corresponding to the SEM photograph of FIG. 26A for an aluminum etch process, in which the etched side walls are concave.

In FIG. 24C, the dome-shaped ceiling 102 is raised by the vertical 1-inch cylindrical spacer 105A so that the coil to wafer distance is greater. As a result, polymer formation is not as suppressed and ion directionality is more vertical, leading to better etch profile and etch selectivity. The superior etch profile obtained in this embodiment provides results corresponding to the SEM photograph of FIG. 26B for an aluminum etch process, in which the etched side walls are straight. Advantageously, the coil 120 is still sufficiently close to the wafer 130 that the ion density is relatively high, as indicated by the curve labelled C in FIG. 23. Moreover, the ion density is more uniform.

Figure 26C:
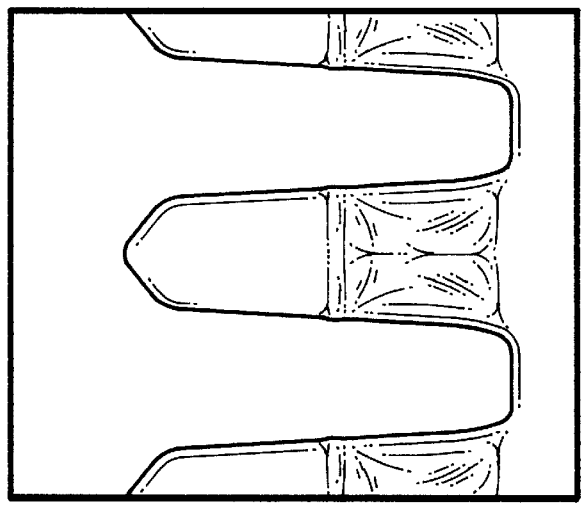
FIG. 26C is an SEM photograph of etched sidewall profiles obtained with an embodiment corresponding to that of FIG. 24D.
Figure 26B:
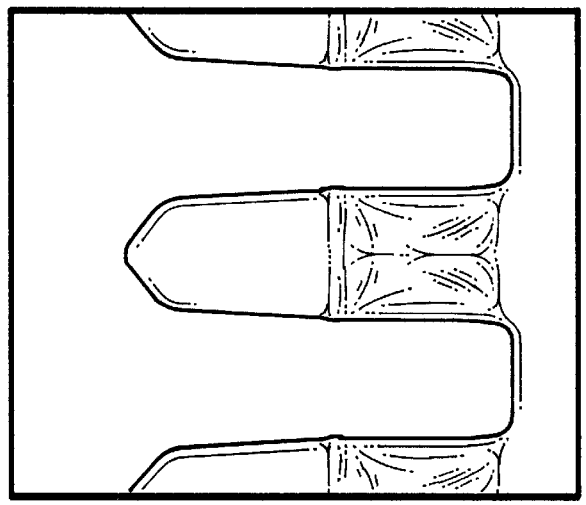
FIG. 26B is an SEM photograph of etched sidewall profiles obtained with an embodiment corresponding to that of FIG. 24C.
Figure 26A:
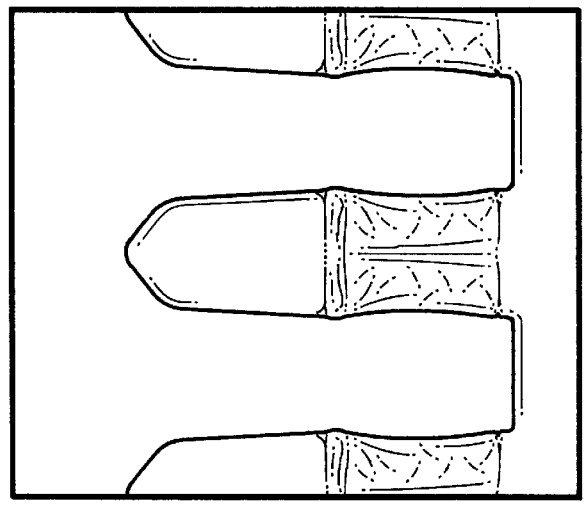
FIG. 26A is a scanning electron microscope (SEM) photograph of etched sidewall profiles obtained with an embodiment corresponding to that of FIG. 24B.

In FIG. 24D, the approximately 2-inch spacer 105B further increases the wafer-to-coil distance, so that the ion density at the wafer surface is less, as indicated by the curve labelled D of FIG. 25. However, the etch profile obtained in the embodiment of FIG. 24D, corresponding to the SEM photographs of FIG. 26D, is virtually the same as that obtained in the embodiment of FIG. 24C.

One advantage of the embodiment of FIG. 24C is that the RF bias power applied to the wafer pedestal may be reduced relative to that employed in the embodiments of FIGS. 24A and 24B, as set forth in TABLE B above. In fact, TABLE B indicates an approximately 15% reduction in RF bias power between the embodiments of FIGS. 24A and 24C. This reduction in bias power reduces ion damage, a significant advantage.

Another advantage is that in the flat ceiling embodiment of FIG. 24A, polysilicon etch selectivity relative to silicon dioxide is less than 15:1, is about 15:1 in the embodiment of FIG. 24B having the dome-shaped coil and approaches 20:1 in the embodiments of FIGS. 24C and 24D.

Table C sets forth the dimensions of a preferred embodiment of the invention.

TABLE C

| H | h | D | d | R | r |
|---|---|---|---|---|---|
| 2.95" | 4.02" | 13.64" | 6" | 14.7" | 2" |

In this embodiment, the coil 120 had its bottom winding starting at the base of the dome ceiling 100 where it meets the cylindrical side wall 105, there being approximately six windings at a pitch of 0.75 inch, the RF plasma source power being applied at about 1.75 turns from the bottom coil end. The corner radius r was centered at the height of the dome base. For a wafer diameter d of 8", the chamber diameter D is preferably on the order of 14" or 15", while for a wafer diameter d of 12", the chamber diameter is preferably on the order of between 18" and 20".

Table D sets forth an alternative set of dimensions for the embodiments of FIGS. 24B, 24C and 24D employing a taller dome-shaped ceiling with conformal coil, the base-to-apex dome height H being 4.7".

TABLE D

| FIG. | H | h | H + h |
|---|---|---|---|
| 24B | 4.7" | 1.9" | 6.6" |
| 24C | 4.7" | 2.9" | 7.6" |
| 24D | 4.7" | 3.9" | 8.6" |

For polysilicon etch processes, h is preferably about 4.2", for metal etch processes h is preferably about 3.2" and for oxide etch processes h is preferably about 2.5".

As in the progression of FIGS. 22A–22D, so in the progression of FIGS. 24A–24D, it is a discovery of the invention that the foregoing problems are solved in the regime where R/r is between about 2 and 10, h is between about 1.5" and about 4" while H is between about 3" and about 6", and where the wafer-to-dome apex height H+h is between on the order of about 6" and 7". Such a regime is applicable not only to the strictly conformal embodiments of FIGS. 22 and 24 but also to the embodiments of FIGS. 1–21. It is also applicable to embodiments in which the ceiling shape is not necessarily a multi-radius dome, but rather conical or flat, for example.

While the invention has been described in detail by specific reference to preferred embodiments, it is understood that variations and modifications thereof may be made without departing from the true spirit and scope of the invention.

What is claimed is:

1. A plasma reactor for processing a workpiece, comprising:
    a pedestal defining a workstation of a diameter d to support a workpiece of a similar diameter on said pedestal within the reactor;
    a chamber enclosure comprising:
        (a) a vertical side wall having a top, and
        (b) a ceiling having a base overlying said top of said side wall;
    an inductive coil overlying said ceiling and capable of being coupled to an RF power supply, wherein said inductive coil comprises plural windings including a bottom winding adjacent said ceiling base and a top winding overlying a radially inner portion of said ceiling; and
    said vertical side wall top being at a height h above said pedestal and said ceiling having an apex at a height H above said ceiling base, wherein H+h is in a range on the order of between about 4" and 7".

2. The plasma reactor of claim 1 wherein said ceiling has one of the following shapes:
    (a) flat;
    (b) conical;
    (c) arcuate;
    (d) multi-radius dome.

3. The plasma reactor of claim 1 wherein said ceiling comprises a multi-radius dome having at least a center radius R and a corner radius r less than the center radius R, wherein R/r is in a range between on the order of 2 and 10.

4. The plasma reactor of claim 1 wherein the base-to-apex height H is in a range between on the order of about 3" and about 6" while the pedestal-to-base height h is between on the order of about 1.5" and about 4".

5. The plasma reactor of claim 1 wherein the base-to-apex height H is in a range between on the order of about 3" and about 6" while the pedestal-to-base height h is between on the order of about 1.5" and about 4".

6. The plasma reactor of claim 1 wherein said top winding defines an aperture of diameter A of said inductive coil.

7. The plasma reactor of claim 6 wherein the coil aperture diameter A is no less than the workstation diameter d.

8. The plasma reactor of claim 1 wherein said diameter d is between about 6 inches and about 12 inches.

9. A method of processing a workpiece in a plasma reactor, comprising:
    providing in said reactor a pedestal defining thereon a workstation of a diameter d and placing on said pedestal a workpiece of similar diameter;
    providing a chamber enclosure, said enclosure including a side wall having a top and a ceiling having a base over said top of said side wall and a ceiling apex above said base;
    providing an inductive coil adjacent said ceiling and capable of being coupled to an RF power supply; and
    setting the height of said pedestal such that said base is at a height h above said pedestal and said ceiling apex is at a height H above said base, wherein H+h is on the order of approximately 4" and 7" for said workstation diameter d within a range between on the order of about 6" and about 12".

10. The method of claim 9 wherein said ceiling comprises a multi-radius dome having at least a center radius R and a corner radius r less than the center radius R, wherein R/r is in a range between on the order of 2 and 10.

11. The method of claim 9 wherein the base-to-apex height H is in a range between on the order of about 3" and about 6" while the pedestal-to-base height h is between on the order of about 1.5" and about 4".

12. The method of claim 10 wherein the base-to-apex height H is in a range between on the order of about 3" and about 6" while the pedestal-to-base height h is between on the order of about 1.5" and about 4".

13. The method of claim 9 wherein said inductive coil comprises plural windings including a bottom winding adjacent said ceiling base and a top winding.

14. The method of claim 13 wherein said top winding defines an aperture of diameter A of said inductive coil.

15. The method of claim 14 wherein the coil aperture diameter A is no less than the workstation diameter d.

16. A method of processing a workpiece in a plasma reactor, comprising:
    providing a pedestal defining thereon a workstation of diameter d and placing on said pedestal a workpiece of similar diameter;
    providing a chamber enclosure including a vertical side wall having a top and a ceiling having a base underlying said top of said side wall and a ceiling apex, said ceiling comprising a multi-radius dome having at least a center radius R and a corner radius r less than the center radius R, wherein R/r is in a range between on the order of about 2 and about 10, said chamber enclosure defining an interior of said reactor containing said pedestal;
    providing an inductive coil overlying said ceiling and an RF power supply coupled to said inductive coil;
    setting a height of said pedestal such that said vertical side wall top is at a height h above said pedestal and said ceiling apex is at a height H above said ceiling base, wherein H+h is in a range on the order of between about 4" and 7".

17. The method of claim 16 wherein the base-to-apex height H is in a range between on the order of about 3" and about 6" while the pedestal-to-base height h is between on the order of about 1.5" and about 4".

18. The method of claim 16 wherein said inductive coil comprises plural windings including a bottom winding adjacent said ceiling base and a top winding.

19. The method of claim 18 wherein said top winding defines an aperture of diameter A of said inductive coil.

20. The method of claim 19 wherein the coil aperture diameter A is no less than the wafer diameter d.

21. A method of processing a workpiece in a plasma reactor, comprising:
    providing a pedestal defining a workstation of a diameter d and placing on said pedestal a workpiece of similar diameter;
    providing a chamber enclosure defining an interior of said reactor containing said pedestal and comprising:

(a) a vertical side wall having a top, and
(b) a ceiling having a base overlying said top of said side wall and a ceiling apex;

providing an inductive coil overlying said ceiling and an RF power supply coupled to said inductive coil, wherein said inductive coil comprises plural windings including a bottom winding adjacent said ceiling base and a top winding overlying a radially inner portion of said ceiling; and setting a height of said pedestal such that said vertical side wall top is at a height h above said pedestal and said ceiling apex is at a height H above said ceiling base, wherein H+h is in a range on the order of between about 4" and 7" for said workstation diameter d within a range between on the order of about 6" and about 12".

22. The method of claim 21 wherein said ceiling comprises a multi-radius dome having at least a center radius R and a corner radius r less than the center radius R, wherein R/r is in a range between on the order of 2 and 10.

23. The method of claim 21 wherein the base-to-apex height H is in a range between on the order of about 3" and about 6" while the pedestal-to-base height h is between on the order of about 1.5" and about 4".

24. The method of claim 22 wherein the base-to-apex height H is in a range between on the order of about 3" and about 6" while the pedestal-to-base height h is between on the order of about 1.5" and about 4".

25. The method of claim 21 wherein said top winding defines an aperture of diameter A of said inductive coil.

26. The method of claim 25 wherein the coil aperture diameter A is no less than the workstation diameter d.

27. A method of processing a workpiece in a plasma reactor, comprising:

providing a pedestal defining a workstation of a diameter d and placing on said pedestal a workpiece of similar diameter;

providing a chamber enclosure defining an interior of said reactor containing said pedestal and comprising:
(a) a vertical side wall having a top, and
(b) a ceiling having a base overlying said top of said side wall and a ceiling apex;

providing an inductive coil overlying said ceiling and an RF power supply coupled to said inductive coil and introducing a process gas into said chamber enclosure whereby to generate a plasma within said chamber enclosure, said plasma having a substantially central symmetric spatial distribution of plasma ion density for a given shape of said ceiling which is center-depressed at a ceiling height below a low height threshold, is center-peaked near a high ceiling threshold and is less center-peaked above said high ceiling threshold; and setting a height of said pedestal such that said vertical side wall top is at a height h above said pedestal and said ceiling apex is at a height H above said ceiling base, wherein H+h is in a range exceeding said high ceiling threshold.

28. The method of claim 27 wherein said range is on the order of between about 4" and 7".

29. The method of claim 28 wherein said ceiling comprises a multi-radius dome having at least a center radius R and a corner radius r less than the center radius R, wherein R/r is in a range between on the order of about 2 and 10.

30. The method of claim 28 wherein the base-to-apex height H is in a range between on the order of about 3" and about 6" while the pedestal-to-base height h is between on the order of about 1.5" and about 4".

31. The reactor of claim 1 wherein said vertical H+h is in a range on the order of between about 4" and 7" for said workstation diameter d within a range between about 6" and 12".

* * * * *